United States Patent
Wan et al.

(10) Patent No.: US 11,545,192 B2
(45) Date of Patent: Jan. 3, 2023

(54) SYSTEM AND METHOD OF POWER MANAGEMENT IN MEMORY DESIGN

(71) Applicants: TAIWAN SEMICONDUCTOR MANUFACTURING COMPANY, LTD., Hsinchu (TW); TSMC CHINA COMPANY, LIMITED, Shanghai (CN)

(72) Inventors: He-Zhou Wan, Hsinchu (TW); XiuLi Yang, Hsinchu (TW); Ming-En Bu, Hsinchu (TW); Mengxiang Xu, Hsinchu (TW); Zong-Liang Cao, Hsinchu (TW)

(73) Assignees: TAIWAN SEMICONDUCTOR MANUFACTURING COMPANY, LTD., Hsinchu (TW); TSMC CHINA COMPANY, LIMITED, Shanghai (CN)

( * ) Notice: Subject to any disclaimer, the term of this patent is extended or adjusted under 35 U.S.C. 154(b) by 0 days.

(21) Appl. No.: 17/185,030

(22) Filed: Feb. 25, 2021

(65) Prior Publication Data
US 2022/0254384 A1    Aug. 11, 2022

(30) Foreign Application Priority Data
Feb. 5, 2021    (CN) .......................... 202110163497.9

(51) Int. Cl.
    *G11C 5/14*    (2006.01)

(52) U.S. Cl.
    CPC .................................. *G11C 5/148* (2013.01)

(58) Field of Classification Search
    CPC ..................................................... G11C 5/148
    See application file for complete search history.

(56) References Cited

U.S. PATENT DOCUMENTS

| | | | |
|---|---|---|---|
| 9,104,214 B2 * | 8/2015 | Huang | G11C 5/148 |
| 9,270,262 B2 * | 2/2016 | Tsai | H03K 17/223 |
| 9,564,180 B1 | 2/2017 | Pilo et al. | |
| 10,664,035 B2 * | 5/2020 | Popovich | G06F 1/26 |
| 2010/0188922 A1 * | 7/2010 | Nakaoka | G11C 5/147 365/227 |
| 2020/0395052 A1 | 12/2020 | Jain et al. | |

* cited by examiner

*Primary Examiner* — Khamdan N. Alrobaie
(74) *Attorney, Agent, or Firm* — Hauptman Ham, LLP

(57) ABSTRACT

A device includes a first virtual power line, a second virtual power line, a first delay circuit, and a first wakeup detector. The first virtual power line and the second virtual power line are coupled to a power supply correspondingly through a first group of transistor switches and a second group of transistor switches. The first delay circuit is coupled between gate terminals of the first group of transistor switches and gate terminals in the second group of transistor switches. The first wakeup detector is configured to generate a first trigger signal after receiving a signal from the first delay circuit.

20 Claims, 13 Drawing Sheets

| | | | | | | | |
|---|---|---|---|---|---|---|---|
| WLDRV 128 | LCTRL 225 | WLDRV 128 | WLDRV 118 | LCTRL 215 | WLDRV 118 | MCTRL 205 |
| MEMORY BANK 140 | LIOs 227 | MEMORY BANK 130 | MEMORY BANK 120 | LIOs 217 | MEMORY BANK 110 | MIOs 207 |

VDDAI[4], VDDHD[2], VDDAI[3], VDDAI[2], VDDHD[1], VDDAI[1], VDDHD[0]

FIG. 4A

| | |
|---|---|
| WLDRV 118 | BANK 120 — VDDAI[2] |
| LCTRL 225 | LIOs 227 — VDDHD[2] |
| WLDRV 118 | BANK 110 — VDDAI[1] |
| LCTRL 215 | LIOs 217 — VDDHD[1] |
| MCTRL 205 | MIOs 207 — VDDHD[0] |

FIG. 4B

SYSTEM AND METHOD OF POWER MANAGEMENT IN MEMORY DESIGN

BACKGROUND

A static random access memory generally includes bitcells distributed in memory banks and various control circuits to control the read operation and write operation of the bitcells. Examples of the control circuits include local input-output circuits, main input-output circuits, local control circuits, and main control circuits. The static random access memory also includes power management circuits to power up or shut down the power supplies for the bitcells and the power supplies for the control circuits.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIG. 4A is a diagram of a floor plan of a portion of function blocks in an SRAM, in accordance with some embodiments.

FIG. 4B is a diagram of a floor plan of a portion of function blocks in another SRAM, in accordance with some embodiments.

DETAILED DESCRIPTION

Figure 1:
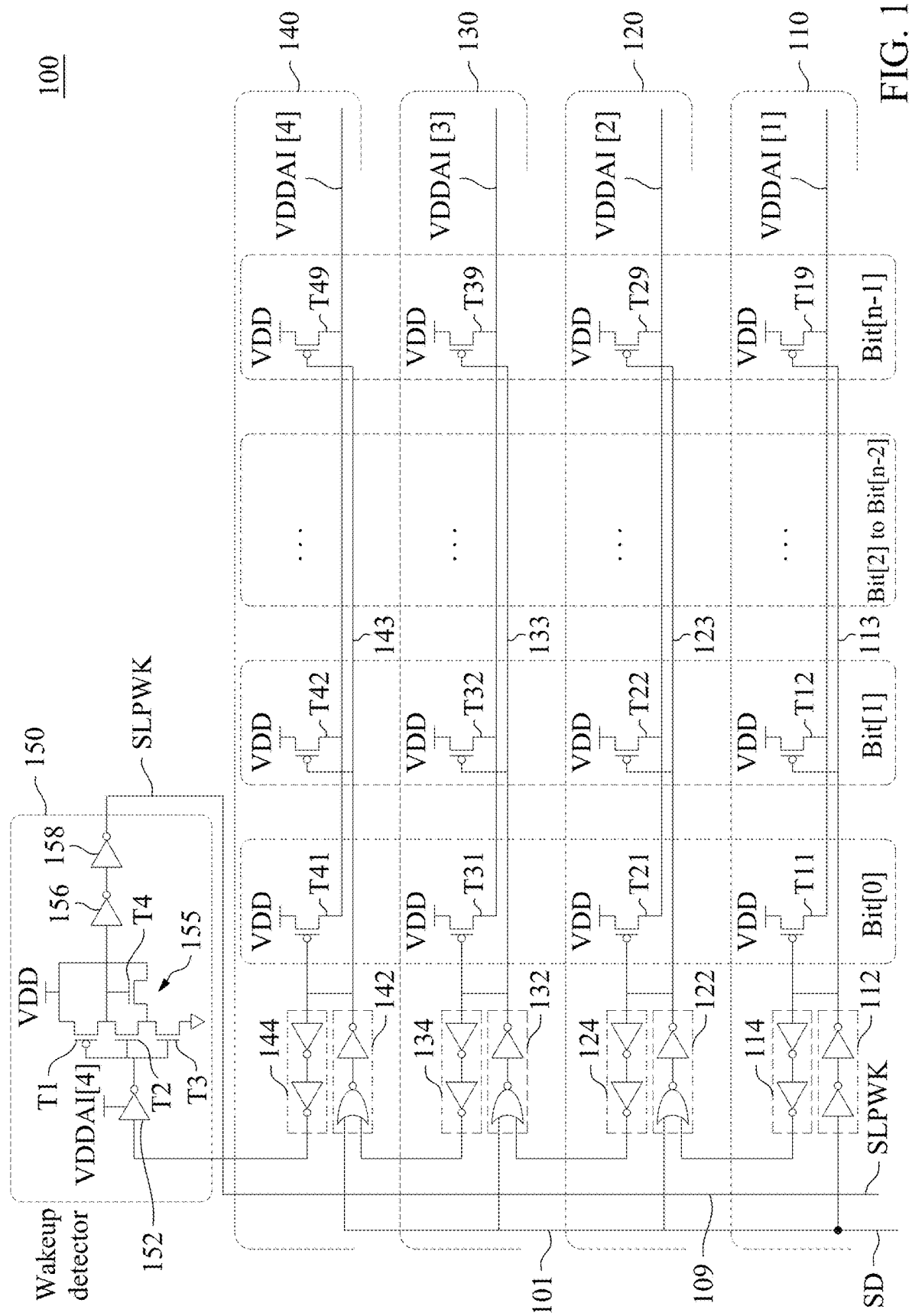
FIG. 1 is a schematic diagram of a part of a power management circuit having virtual power lines to power the memory cells in a memory device, in accordance with some embodiments.

The following disclosure provides many different embodiments, or examples, for implementing different features of the provided subject matter. Specific examples of components, materials, values, steps, operations, materials, arrangements, or the like, are described below to simplify the present disclosure. These are, of course, merely examples and are not intended to be limiting. Other components, values, operations, materials, arrangements, or the like, are contemplated. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

A static random access memory (SRAM) includes power management circuits to power up or shut down the power supplies for the bitcells and the power supplies for the control circuits. Examples of the control circuits include local input-output circuits (LIOs), main input-output circuits (MIOs), word-line drivers (WLDRVs), local control circuits (LCTRLs), and main control circuits (MCTRLs). The LIOs provide a data interface between the MIOs and the bitcells in one or more memory banks. The word-line drivers are configured to select rows of the bitcells to participate in the read and/or the write operations. The MIOs provide a data interface between the SRAM and external circuits. Local control circuits are configured to control the LIOs. In some embodiments, the local control circuits include column-address decoders and row-address decoders. The main control circuits include the address pre-decoders and the synchronization clock.

In some design implementations of the SRAMs, when the bitcells are powered from virtual power lines, the power supplies for the bitcells are managed by the Field Effect Transistors (FETs) switches between the real power supply (e.g., the pull-up power supply VDD or the pull-down power supply VSS) and the corresponding virtual power lines. In some design implementations of the SRAMs, when the control circuits of the SRAMs are powered from virtual power lines, the power supplies for the control circuits of the SRAMs are managed by transistor switches such as FET switches between the real power supply and the control circuits of the SRAMs.

In some design implementations of the SRAMs, to power up the bitcells and the control circuits of the SRAMs, the bitcells are divided into groups, the bitcells are powered up by individual groups with daisy chain wake up schemes having time delays between different groups. The control circuits of the SRAMs are powered up similarly, and the individual parts of the SRAMs are powered up with daisy chain wake up schemes having time delays between different parts. In some design implementations of the SRAMs, the balances between the peak-current and the time required to power up the SRAMs are not optimized when simple daisy chain wake up schemes are used. It is desirable to have power management methods and systems that provide better balances between the peak-current and the time required to power up the SRAMs.

FIG. 1 is a schematic diagram of a part of a power management circuit 100 having virtual power lines to power the memory cells in a memory device, in accordance with some embodiments. In FIG. 1, bitcells are distributed in four memory banks (e.g., 110, 120, 130, and 140). The details of the bitcells have been omitted for clarity. Various different types of the bitcells for using in the memory banks and different configurations of the memory banks are within the contemplate scope of the present disclosure. Examples of the bitcell for constructing the memory banks include a synchronous bitcell, an asynchronous bitcell, a one-port SRAM bitcell, a two-ports SRAM bitcell, a quad-ports SRAM bitcell, a six transistors 6T SRAM cell, an eight transistors 8T SRAM cell, a ten transistors 10T SRAM cell, or a twelve transistors 12T SRAM cell. In FIG. 1, the bitcells in the memory banks are powered from virtual power lines.

In contrast to a real power line (such as, the power rail for the pull-up power supply VDD, or the power rail for the pull-down power supply VSS), the voltage level on a virtual power line is dynamically managed and may depend upon the status of the memory device. As an example, in some embodiments, when a memory device changes from a power-up mode to a sleep mode, the voltage level on a virtual power line for the pull-up power changes from the voltage level of VDD to a float level (or to a ground level), whereas the voltage level on a real power line for the pull-up power remains at the constant level of VDD. In some embodiments, the voltage level on a virtual power line is determined by one or more switching elements between the virtual power line and a corresponding real power line. For example, when a header switch (such as an FET) is operationally coupled between a virtual power line for VDD and a power rail for the pull-up power supply VDD, the state of the header switch determines the voltage level on the virtual power line for VDD. When the header switch is in the closed state, the virtual power line for VDD functions as a voltage source with the voltage level of VDD. When the header switch is in the open state, the voltage level on the virtual power line for VDD is floating and the virtual power line for VDD does not function as a voltage source to provide power. Similarly, when a footer switch (such as a FET) is operationally coupled between a virtual power line for VSS and a power rail for the pull-down power supply VSS, the state of the footer switch determines the voltage level on the virtual power line for VSS.

In FIG. 1, each of the memory banks (e.g., 110, 120, 130, and 140) includes rows with a fixed number of bitcells (e.g., Bit[0], Bit[0], . . . , and Bit[n−1]). The bitcells in the memory bank 110 are powered from a virtual power line VDDAI[1].

The bitcells in the memory bank 120 are powered from a virtual power line VDDAI[2]. The bitcells in the memory bank 130 are powered from a virtual power line VDDAI[3]. The bitcells in the memory bank 140 are powered from a virtual power line VDDAI[4]. The virtual power lines are coupled to the supply voltage VDD through wakeup switches. Specifically, the virtual power line VDDAI[1] is coupled to the supply voltage VDD through wakeup switches T11, T12, . . . , and T19. The virtual power line VDDAI[2] is coupled to the supply voltage VDD through wakeup switches T21, T22, . . . , and T29. The virtual power line VDDAI[3] is coupled to the supply voltage VDD through wakeup switches T31, T32, . . . , and T39. The virtual power line VDDAI[4] is coupled to the supply voltage VDD through wakeup switches T41, T42, . . . , and T49.

In some alternative embodiments, a virtual power line for VDD is used for providing the VDD power supply for all bitcells in a memory bank. In some alternative embodiments, a virtual power line for VDD is used for providing the VDD power supply exclusively for a row of the bitcells in a memory bank. In some alternative embodiments, a virtual power line for VDD is used for providing the VDD power supply exclusively for a column of the bitcells in a memory bank. In still some alternative embodiments, a virtual power line for VDD is used for providing the VDD power supply exclusively for a number of the bitcells in a memory bank (such as one or two bitcells).

In FIG. 1, the power management circuit includes a wakeup detector 150 and several delay circuits (e.g., 112, 114, 122, 124, 132, 134, 142, and 144). Each of the delay circuits (e.g., 112, 114, 122, 124, 132, 134, 142, and 144) has a first input and an output. Each of the delay circuits 122, 132, and 142 also has a second input. The first input of the delay circuit 112, and the second inputs of the delay circuits 122, 132, and 142 are coupled to a control line connecting to a control input 101 of the power management circuit 100.

The gate terminals of the wakeup switches (e.g., T11, T12, . . . , and T19) for the virtual power line VDDAI[1] are connected to a control line 113 and coupled to both the output of the delay circuit 112 and the first input of the delay circuit 114. The wakeup switches (e.g., T11, T12, . . . , and T19) for the virtual power line VDDAI[1] control the power connections between the virtual power line VDDAI[1] and the power nodes for the supply voltage VDD. The gate terminals of the wakeup switches (e.g., T21, T22, . . . , and T29) for the virtual power line VDDAI[2] are connected to a control line 123 and coupled to both the output of the delay circuit 122 and the first input of the delay circuit 124. The wakeup switches (e.g., T21, T22, . . . , and T29) for the virtual power line VDDAI[2] control the power connections between the virtual power line VDDAI[2] and the power nodes for the supply voltage VDD. The gate terminals of the wakeup switches (e.g., T31, T32, . . . , and T39) for the virtual power line VDDAI[3] are connected to a control line 133 and coupled to both the output of the delay circuit 132 and the first input of the delay circuit 134. The wakeup switches (e.g., T31, T32, . . . , and T39) for the virtual power line VDDAI[3] control the power connections between the virtual power line VDDAI[3] and the power nodes for the supply voltage VDD. The gate terminals of the wakeup switches (e.g., T41, T42, . . . , and T49) for the virtual power line VDDAI[4] are connected to a control line 143 and coupled to both the output of the delay circuit 142 and the first input of the delay circuit 144. The wakeup switches (e.g., T41, T42, . . . , and T49) for the virtual power line VDDAI[4] control the power connections between the virtual power line VDDAI[4] and the power nodes for the supply voltage VDD. The output of the delay circuit 144 is couple to the input of the wakeup detector 150. The output of the wakeup detector 150 is couple to a control output 109. In FIG. 1, the wakeup switches are transistor switches such as FET switches.

In operation, when a control signal SD on the control input 101 indicates a VDDAI-down state, VDDAI-down signals are applied to the control lines 113, 123, 133, and 143 correspondingly through the delay circuits 112, 122, 132, and 142. The VDDAI-down signal on the control line 113 is transmitted to the gate terminals of the wakeup switches (e.g., T11, T12, . . . , and T19) for the virtual power line VDDAI[1]. When the VDDAI-down signal is applied to the control line 113, the wakeup switches (e.g., T11, T12, and T19) for the virtual power line VDDAI[1] are set to an open state and break the conductive connections between the virtual power line VDDAI[1] and the power nodes for the supply voltage VDD, and as a consequence, the bitcells in the memory bank 110 lose the power connections. Similarly, when the VDDAI-down signal is applied to the control line 123, the wakeup switches (e.g., T21, T22, and T29) for the virtual power line VDDAI[2] break the conductive connections between the virtual power line VDDAI[2] and the power nodes for the supply voltage VDD, and the bitcells in the memory bank 120 lose the power connections. When the VDDAI-down signal is applied to the control line 133, the wakeup switches (e.g., T31, T32, and T39) for the virtual power line VDDAI[3] break the conductive connections between the virtual power line VDDAI[3] and the power nodes for the supply voltage VDD, and the bitcells in the memory bank 130 lose the power connections. When the VDDAI-down signal is applied to the control line 143, the wakeup switches (e.g., T41, T42, and T49) for the virtual power line VDDAI[4] break the conductive connections between the virtual power line VDDAI[4] and the power nodes for the supply voltage VDD, and the bitcells in the memory bank 140 lose the power connections.

In operation, when a control signal SD on the control input 101 indicates a change from a VDDAI-down state to a VDDAI-up state, VDDAI-up signals are applied to the first input of the delay circuit 112 and the second inputs of the delay circuits 122, 132, and 142. Because the first inputs of the delay circuits 122, 132, and 142 are maintained logic HIGH when the bitcells in the memory banks (e.g., 110, 120, 130, and 140) are at VDDAI-down states, the VDDAI-up signals (with logic LOW) applied to the second inputs of the delay circuits 122, 132, and 142 do not immediately change the logic levels at the outputs of the delay circuits 122, 132, and 142. The bit cells in the memory banks (e.g., 110, 120, 130, and 140) remain at the VDDAI-down states at the instant that the control signal SD changes to the VDDAI-up signal.

After the VDDAI-up signal is applied to the first input of the delay circuit 112, the switch-on signal is applied to the control line 113 and transmitted to the gate terminals of the wakeup switches (e.g., T11, T12, . . . , and T19) for the virtual power line VDDAI[1], and the wakeup switches (e.g., T11, T12, . . . , and T19) are changed to the closed state. Consequently, the virtual power line VDDAI[1] is conductively connected to the power nodes for the supply voltage VDD through the wakeup switches (e.g., T11, T12, . . . , and T19), and the bitcells in the memory bank 110 obtain the power connections.

After a delay from the time at which the switch-on signal is applied to the control line 113, the switch-on signal is transmitted through the delay circuit 114 to the first input of the delay circuit 122. After a further delay caused by the delay circuit 122, the switch-on signal is applied to the control line 123 and transmitted to the gate terminals of the wakeup switches (e.g., T21, T22, . . . , and T29) for the virtual power line VDDAI[2]. The switch-on signal at the gate terminals causes the wakeup switches (e.g., T21, T22, . . . , and T29) for the virtual power line VDDAI[2] to be changed to the closed state, and as a consequence, the virtual power line VDDAI[2] is conductively connected to the power nodes for the supply voltage VDD through the wakeup switches (e.g., T21, T22, . . . , and T29), and the bitcells in the memory bank 120 obtain the power connections.

The delay time $\Delta t[12]$ between the time at which the switch-on signal is applied to the control line 113 and the time at which the switch-on signal is applied to the control line 123 is selected to reduce the total peak current. When the delay time $\Delta t[12]$ is less than certain critical value, the peak value of the sum of the current I-AI[1] and I-AI[2] can be larger than the peak value of the current I-AI[1] or the peak value of the current I-AI[2]. Generally, when the peak value of the sum of the current I-AI[1] and I-AI[2] is larger than the peak value of each of the current I-AI[1] and the current I-AI[2], increasing the delay time $\Delta t[12]$ causes the peak value of the sum of the current I-AI[1] and I-AI[2] to decrease. Increasing the delay time $\Delta t[12]$, however, will increase the time required for the memory device to wake up from a sleep mode. There is an optimized value for the time delay $\Delta t[12]$. In some embodiments, the delay time $\Delta t[12]$ is selected to be a minimal delay time possible that satisfies the criteria that the peak value due to the sum of the current I-AI[1] and I-AI[2] is less than a predetermined current value. In some embodiments, the predetermined current value is less than or equal to a read or write peak current, which is designed based on the consideration about the System-On-Chip (SOC) power management capacity. In some embodiments, the predetermined current value is 120% of the peak value of the current I-AI[1] or 120% of the peak value of the current I-AI[2].

Similarly, after a delay from the time at which the switch-on signal is applied to the control line 123, the switch-on signal is transmitted through the delay circuit 124 to the first input of the delay circuit 132. After a further delay caused by the delay circuit 132, the switch-on signal is applied to the control line 133 and transmitted to the gate terminals of the wakeup switches (e.g., T31, T32, . . . , and T39) for the virtual power line VDDAI[3]. The switch-on signal at the gate terminals causes the wakeup switches (e.g., T31, T32, . . . , and T39) for the virtual power line VDDAI[3] to be changed to the closed state, and as a consequence, the virtual power line VDDAI[3] is conductively connected to the power nodes for the supply voltage VDD through the wakeup switches (e.g., T31, T32, . . . , and T39), and the bitcells in the memory bank 130 obtain the power connections. The delay time $\Delta t[23]$ between the time at which the switch-on signal is applied to the control line 123 and the time at which the switch-on signal is applied to the control line 133 is selected to reduce the total peak current. The selected delay time $\Delta t[23]$ depends upon both the current I-AI[2] flowing into the virtual power line VDDAI[2] and the current I-AI[3] flowing into the virtual power line VDDAI[3]. In some embodiments, the delay time $\Delta t[23]$ is selected to be a minimal delay time possible that satisfies the criteria that the peak value due to the sum of the current I-AI[2] and I-AI[3] is less than a predetermined current value. In some embodiments, the predetermined current value is less than or equal to a read or write peak current, which is designed based on the consideration about the System-On-Chip (SOC) power management capacity. In some embodiments, the predetermined current value is 120% of the peak value of the current I-AI[2] or 120% of the peak value of the current I-AI[3].

After a delay from the time at which the switch-on signal is applied to the control line 133, the switch-on signal is transmitted through the delay circuit 134 to the first input of the delay circuit 142. After a further delay caused by the delay circuit 142, the switch-on signal is applied to the control line 143 and transmitted to the gate terminals of the wakeup switches (e.g., T41, T42, . . . , and T49) for the virtual power line VDDAI[4]. The switch-on signal at the gate terminals causes the wakeup switches (e.g., T41, T42, . . . , and T49) for the virtual power line VDDAI[4] to be changed to the closed state, and as a consequence, the virtual power line VDDAI[4] is conductively connected to the power nodes for the supply voltage VDD through the wakeup switches (e.g., T41, T42, . . . , and T49), and the bitcells in the memory bank 140 obtain the power connections. The delay time Δt[34] between the time at which the switch-on signal is applied to the control line 133 and the time at which the switch-on signal is applied to the control line 143 is selected to reduce the total peak current.

After a delay from the time at which the switch-on signal is applied to the control line 143, the switch-on signal is transmitted through the delay circuit 144 to an input of the wakeup detector 150. The wakeup detector 150 is designed to generate a trigger signal SLPWK, when the voltage levels on the virtual power lines (e.g., VDDAI[1], VDDAI[2], VDDAI[3], and VDDAI[4]) reach the levels as designed. In FIG. 1, the wakeup detector 150 detects the voltage level on the virtual power line VDDAI[4]. After the wakeup detector 150 receives the switch-on signal from the output of the delay circuit 144, if the voltage level on the virtual power line VDDAI[4] is above a predetermined level, the trigger signal SLPWK is generated at the output and transmitted to the control output 109. In FIG. 1, because the starting time for connecting the power nodes to the virtual power line VDDAI[4] is after the starting time for connecting the power nodes to other virtual power lines (e.g., VDDAI[1], VDDAI[2], and VDDAI[3]), at the time that the voltage level on the virtual power line VDDAI[4] is at a level above a predetermined threshold level, the voltage levels on other virtual power lines (e.g., VDDAI[1], VDDAI[2], and VDDAI[3]) are also expected to be at levels above the predetermined threshold level. That is, when the trigger signal SLPWK is generated at the output and transmitted to the control output 109, the voltage levels on all virtual power lines (e.g., VDDAI[1], VDDAI[2], VDDAI[3], and VDDAI[4]) are expected to be above the predetermined threshold level.

In FIG. 1, the wakeup detector 150 includes an inverter 152, a half Schmitt trigger 155, an inverter 156, and an inverter 158. The half Schmitt trigger 155 includes a PMOS transistor T1 and three NMOS transistors T2, T3, and T4. The trigger threshold of the half Schmitt trigger 155 is adjusted by changing the size of the feedback NMOS T4. The inverter 152 has an input that receives a signal from the delay circuit 144 and has an output that generates the trigger signal SLPWK based on a signal received at the input of the inverter 156. The inverter 152 is powered by the voltage on the virtual power line VDDAI[4]. When the voltage on the virtual power line VDDAI[4] is below a predetermined threshold level, the inverter 152 is not in operation mode, and the logic level at the input of the inverter 152 is not inverted at the output of the inverter 152. In operation, as soon as the voltage on the virtual power line VDDAI[4] is above the predetermined threshold level, the logic level at the input of the inverter 152 is inverted at the output of the inverter 152. The logic level change at the output of the inverter 152 triggers the half Schmitt trigger 155, which generates a signal change at the output of the half Schmitt trigger 155. The signal change at the output of the half Schmitt trigger 155, after passing through the inverters 156 and 158, generates a trigger signal SLPWK at the output of the wakeup detector 150. The trigger signal SLPWK, which is transmitted to the control output 109, indicates that the voltage levels on virtual power lines (e.g., VDDAI[1], VDDAI[2], VDDAI[3], and VDDAI[4]) are above the predetermined threshold level. The trigger signal SLPWK on the control output 109 is coupled to a power management circuit (e.g., the circuit in FIG. 2) having virtual power lines to power various control circuits in a memory device.

In FIG. 1, when each of the virtual power lines (e.g., VDDAI[1], VDDAI[2], VDDAI[3], or VDDAI[4]) is sequentially turned on after a corresponding delay time (e.g., Δt[12], Δt[23], or Δt[34]), the VDD voltage will be applied to virtual power lines. In some embodiments, the VDD voltage is applied to each virtual power line sequentially after the corresponding delay time. In some alternative embodiments, however, the VDD voltage is applied to two or more virtual power lines together as a group, even though each of the virtual power lines is sequentially turned on after a corresponding delay time. For example, when all of the virtual power lines VDDAI[1], VDDAI[2], VDDAI[3], and VDDAI[4] are conductively connected, the VDD voltage is applied to all of the virtual power lines together as a group. As another example, when the virtual power lines VDDAI[1] and VDDAI[2] are conductively connected together as a first group and the virtual power lines VDDAI[3] and VDDAI[4] are conductively connected together as a second group, the VDD voltage is applied to all the virtual power lines in the first group before the VDD voltage is applied to all the virtual power lines in the second group. In some embodiments, all or some of the virtual power lines are conductively connected together to reduce the IR-drop caused by the read and/or write operations on the memory banks.

Figure 2:
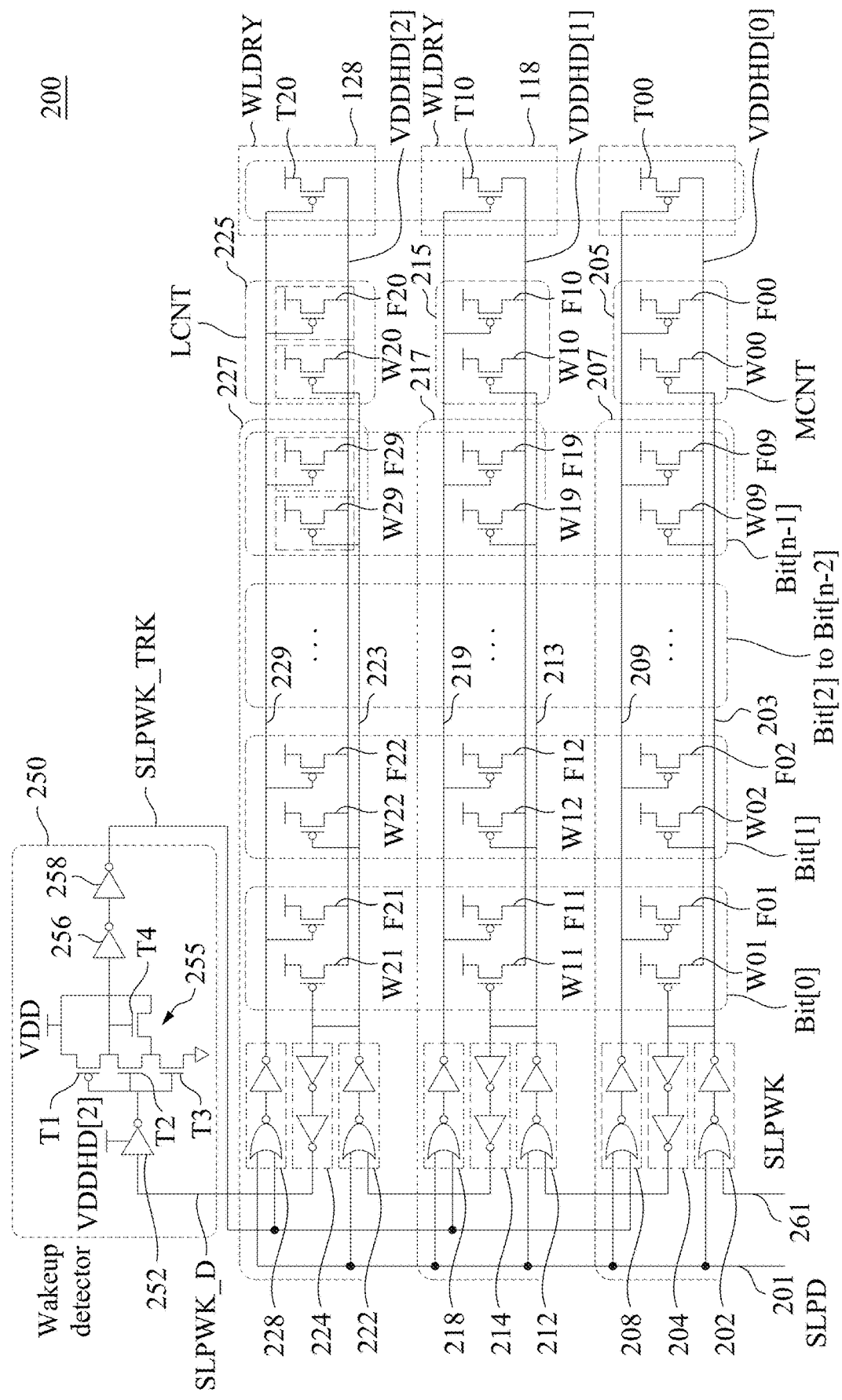
FIG. 2 is a schematic diagram of a part of a power management circuit having virtual power lines to power various control circuits in a memory device, in accordance with some embodiments.

FIG. 2 is a schematic diagram of a part of a power management circuit having virtual power lines to power various control circuits in a memory device, in accordance with some embodiments. In some embodiments, the control circuits include local input-output circuits (LIOs), main input-output circuits (MIOs), word-line drivers (WLDRVs), local control circuits (LCTRLs), and main control circuits (MCTRLs). In FIG. 2, the MIOs 207 and the corresponding MCTRL 205 are powered by a virtual power line VDDHD [0]. The LIOs 217, and the WLDRV 118, and the corresponding LCTRL 215 are powered by a virtual power line VDDHD[1]. Some WLDRVs associated with the LCTRL 215 are also powered by the virtual power line VDDHD[1]. The LIOs 227, and the WLDRV 128, and the corresponding LCTRL 225 are powered by a virtual power line VDDHD [2]. Some WLDRVs associated with the LCTRL 225 are also powered by the virtual power line VDDHD[2].

In FIG. 2, the virtual power lines are coupled to the supply voltage VDD through wakeup switches. The virtual power line VDDHD[0] is coupled to the supply voltage VDD through an array of wakeup switches (e.g., W00, W01, W02, . . . , and W09) and an array of function switches (e.g., T00, F00, F01, F02, . . . , and F09). The virtual power line VDDHD[1] is coupled to the supply voltage VDD through an array of wakeup switches (e.g., W10, W11, W12, . . . , and W19) and an array of function switches (e.g., T10, F10, F11, F12, . . . , and F19). The virtual power line VDDHD[2] is coupled to the supply voltage VDD through an array of wakeup switches (e.g., W20, W21, W22, . . . , and W29) and an array of function switches (e.g., T20, F20, F21, F22, . . . , and F29). In FIG. 2, the wakeup switches and function switches are implemented as transistor switches such as FET switches.

In FIG. 2, the power management circuit 200 includes a wakeup detector 250 and several delay circuits (e.g., 202, 204, 208, 212, 214, 218, 222, 224, and 228). Each of the delay circuits (e.g., 202, 204, 208, 212, 214, 218, 222, 224, and 228) has a first input and an output. The first input of the delay circuit 202 is coupled to the first control input 261 of the power management circuit 200. Each of the delay circuits 202, 208, 212, 218, 222, and 228 has a second input that is coupled to the control line connecting to the second control input 201 of the power management circuit 200.

The gate terminals of the wakeup switches (e.g., W00, W01, W02, . . . , and W09) for the virtual power line VDDHD[0] are connected to a control line 203 and coupled to both the output of the delay circuit 202 and the first input of the delay circuit 204. The gate terminals of the function switches (e.g., T00, F00, F01, F02, . . . , and F09) for the virtual power line VDDHD[0] are connected to a control line 209 and coupled to the output of the delay circuit 208. The wakeup switches (e.g., W00, W01, W02, . . . , and W09) for the virtual power line VDDHD[0] control the power connections between the virtual power line VDDHD[0] and the power nodes for the supply voltage VDD. The function switches (e.g., T00, F00, F01, F02, . . . , and F09) for the virtual power line VDDHD[0] control additional power connections between the virtual power line VDDHD[0] and the power nodes for the supply voltage VDD.

The gate terminals of the wakeup switches (e.g., W10, W1, W12, . . . , and W19) for the virtual power line VDDHD[1] are connected to a control line 213 and coupled to both the output of the delay circuit 212 and the first input of the delay circuit 214. The gate terminals of the function switches (e.g., T10, F10, F11, F12, . . . , and F19) for the virtual power line VDDHD[1] are connected to a control line 219 and coupled to the output of the delay circuit 218. The wakeup switches (e.g., W10, W11, W12, . . . , and W19) for the virtual power line VDDHD[1] control the power connections between the virtual power line VDDHD[1] and the power nodes for the supply voltage VDD. The function switches (e.g., T10, F10, F11, F12, . . . , and F19) for the virtual power line VDDHD[1] control additional power connections between the virtual power line VDDHD[1] and the power nodes for the supply voltage VDD.

The gate terminals of the wakeup switches (e.g., W20, W21, W22, . . . , and W29) for the virtual power line VDDHD[2] are connected to a control line 223 and coupled to both the output of the delay circuit 222 and the first input of the delay circuit 224. The gate terminals of the function switches (e.g., T20, F20, F21, F22, . . . , and F29) for the virtual power line VDDHD[2] are connected to a control line 229 and coupled to the output of the delay circuit 228. The wakeup switches (e.g., W20, W21, W22, . . . , and W29) for the virtual power line VDDHD[2] control the power connections between the virtual power line VDDHD[2] and the power nodes for the supply voltage VDD. The function switches (e.g., T20, F20, F21, F22, . . . , and F29) for the virtual power line VDDHD[2] control additional power connections between the virtual power line VDDHD[2] and the power nodes for the supply voltage VDD.

The output of the delay circuit 224 is coupled to the input of the wakeup detector 250. The output of the wakeup detector 250 is coupled to the first inputs of the delay circuit 208, 218, and 228. The wakeup detector 250 includes an inverter 252, a half Schmitt trigger 255, an inverter 256, and an inverter 258. The half Schmitt trigger 255 includes a PMOS transistor T1 and three NMOS transistors T2, T3, and T4. The trigger threshold of the half Schmitt trigger 255 is adjusted by changing the size of the feedback NMOS T4. The inverter 252 has an input that receives a signal from the delay circuit 244 and has an output coupled to the input of the half Schmitt trigger 255. The inverter 252 is powered by the voltage on the virtual power line VDDHD[2]. When the voltage on the virtual power line VDDHD[2] is below a predetermined threshold level, the inverter 252 is not in operation mode, and the inverted logic level at the output of the inverter 252 is not an inversion of the logic level at the input of the inverter 252. When the voltage on the virtual power line VDDHD[2] is above the predetermined threshold level, if the input of the wakeup detector 250 receives the SLPWK_D signal from the delay circuit 224, a trigger signal SLPWK_TRK will be generated at the output of the wakeup detector 250.

Figure 3:
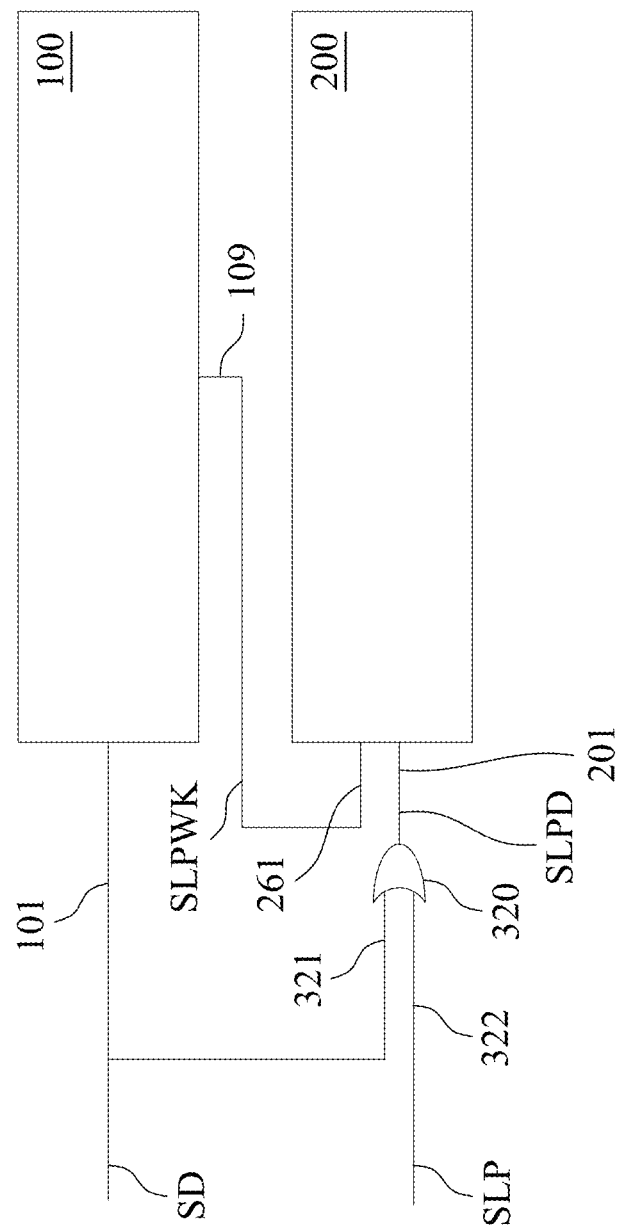
FIG. 3 is a schematic diagram of a circuit combination of the power management circuits in FIG. 1 and FIG. 2, in accordance with some embodiments.

In some embodiments, as shown in FIG. 3, the power management circuit 200 in FIG. 2 functions together with the power management circuit 100 in FIG. 1. In FIG. 3, the first control input 261 of the power management circuit 200 is connected to the control output 109 of the power management circuit 100. The second control input 201 of the power management circuit 200 is connected to the output of an OR-gate 320. The control input 101 of the power management circuit 100 and the first input 321 of the OR-gate 320 are configured to receive the control signal SD. The second input 322 of the OR-gate 320 is configured to receive the control signal SLP. In some embodiments, the control signal SD uses logic HIGH to indicate a power-down signal and logic LOW to indicate a power-up signal. In some embodiments, the control signal SLP uses logic HIGH to indicate a sleep signal and logic LOW to indicate a sleep wake-up signal. The output of the OR-gate 320 generates a control signal SLPD based on the control signal SD received at the first input 321 and the control signal SLP received at the second input 322. The control signal SLPD is at logic LOW whenever the control signal SD is at logic LOW or the control signal SLP is at logic LOW.

In some embodiments, the memory banks controlled by the power management circuit in FIG. 3 are either in the operation mode, the shutdown mode, or the sleep mode. When the memory banks are in the operation mode, the virtual power lines VDDAI in the power management circuit 100 are turned on while the virtual power lines VDDHD in the power management circuit 200 are also turned on. When the memory banks are in the shutdown mode, the virtual power lines VDDAI in the power management circuit 100 are turned off while the virtual power lines VDDHD in the power management circuit 200 are also turned off. When the memory banks are in the sleep mode, the virtual power lines VDDAI in the power management circuit 100 are turned on while the virtual power lines VDDHD in the power management circuit 200 are turned off. In some embodiments, when the virtual power lines VDDAI in the power management circuit 100 are turned on, the SLPWK signal from the control output 109 of the power management circuit 100 is set to logic LOW.

In operation, when the control signal SD is set to logic HIGH, the memory banks are changed to the shutdown mode. When the control signal SD is changed from logic HIGH to logic LOW, the memory banks are changed from the shutdown mode to the operation mode. When the control signal SLP is set to logic HIGH, the memory banks are changed to the sleep mode. When the control signal SLP is changed from logic HIGH to logic LOW, the memory banks are woken from the sleep mode and changed to the operation mode.

In operation, when the control signal SD is set to logic HIGH for changing the memory banks to the shutdown mode or when the control signal SLP is set to logic HIGH for changing the memory banks to the sleep mode, the control signal SLPD at the output of the OR-gate 320 in FIG. 3 is changed to logic HIGH as the response and coupled to the second control input 201 of the power management circuit 200.

In FIG. 2, when the control signal SLPD received at the second control input 201 is at logic HIGH to indicate a VDDHD-down state, VDDHD-down signals are applied to the control lines 203, 213, and 223 correspondingly through the delay circuits 202, 212, and 222, and the wakeup switches for the virtual power lines VDDHD[0], VDDHD [1], and VDDHD[2] are all set to the open state. Additionally, VDDHD-down signals are applied to the control lines 209, 219, and 229 correspondingly through the delay circuits 208, 218, and 228, and function switches for the virtual power lines VDDHD[0], VDDHD[1], and VDDHD[2] are all set to the open state. The MIOs 207 and the MCTRL 205 all lose power connections, because the power connections between the virtual power line VDDHD[0] and the supply voltage VDD are opened by the corresponding wakeup switches and the corresponding function switches. The LIOs 217, the WLDRV 118, and the corresponding LCTRL 215 and are all without power connections, because the power connections between the virtual power line VDDHD[1] and the supply voltage VDD are opened by the corresponding wakeup switches and the corresponding function switches. The LIOs 227, the WLDRV 128, and the corresponding LCTRL 225 are all without power connections, because the power connections between the virtual power line VDDHD [2] and the supply voltage VDD are opened by the corresponding wakeup switches and the corresponding function switches. Additionally, the WLDRVs that receive power from the virtual power lines VDDHD[0], VDDHD[1], and VDDHD[2] are all without power connections.

In operation, when the control signal SD is changed from logic HIGH to logic LOW for changing the memory banks from the shutdown mode to the operation mode, the control signal SD is received at the control input 101 of the power management circuit 100 in FIG. 3. The control signal SD is also received at the first input 321 of the OR-gate 320 in FIG. 3. If the control signal SLP at the second input 322 of the OR-gate 320 is maintained at logic LOW to indicate that the memory banks is not in the sleep mode, when the control signal SD is changed from logic HIGH to logic LOW, the control signal SLPD at the output of the OR-gate 320 is correspondingly changed from logic HIGH to logic LOW and coupled to the second control input 201 of the power management circuit 200.

The control signal SD (with logic LOW) received at the control input 101 will turn on the virtual power lines VDDAI in the power management circuit 100. The control signal SLPD (with logic LOW) received at the second control input 201 will not instantly turn on the virtual power lines VDDHD in the power management circuit 200. Instead, the control signal SLPD (with logic LOW) received at the second control input 201 will turn on the virtual power lines VDDHD in the power management circuit 200 after some delay time during which the virtual power lines VDDAI in the power management circuit 100 have been turned on by the control signal SD (with logic LOW) received at the control input 101. In FIG. 3, the SLPWK signal is generated at the control output 109 of the power management circuit 100, when the virtual power lines VDDAI in the power management circuit 100 are turned on. The SLPWK signal from the power management circuit 100 is coupled to the first control input 261 of the power management circuit 200. When the control signal SLPD received at the second control input 201 is at logic LOW, the SLPWK signal received by the power management circuit 200 will turn on the virtual power lines VDDHD in the power management circuit 200.

In FIG. 2, when the control signal SLPD received at the second control input 201 is changed from logic HIGH to logic LOW to indicate a change from a VDDHD-down state to a VDDHD-up state, VDDHD-up signals (with logic LOW) are applied to the second inputs of the delay circuits 202, 212, 222, 208, 218, and 228. When the first inputs of the delay circuits 202, 212, and 222 are maintained at logic HIGH, the VDDHD-up signals (with logic LOW) applied to the second inputs of the delay circuits 202, 212, and 222 do not immediately change the logic levels of the output of the delay circuits 202, 212, and 222. Similarly, when the first inputs of the delay circuits 208, 218, and 228 are maintained at logic HIGH, the VDDHD-up signals (with logic LOW) applied to the second inputs of the delay circuits 208, 218, and 228 do not immediately change the logic levels of the output of the delay circuits 208, 218, and 228. The power connections between the supply voltage VDD and the virtual power lines VDDHD[0], VDDHD[1], and VDDHD[2] remain open at the time at which the control signal SLPD changes to the VDDHD-up signal.

After some delay time during which the virtual power lines VDDAI in the power management circuit 100 are turned on, the SLPWK signal (with logic LOW) generated by the power management circuit 100 is transmitted to the first control input 261 of the power management circuit 200. When the SLPWK signal is received by the first input of the delay circuit 202, and a switch-on signal will be applied to the control line 203 through the delay circuit 202 and transmitted to the gate terminals of the wakeup switches (e.g., W00, W01, W02, . . . , and W09) for the virtual power line VDDHD[0]. When the switch-on signal is applied to the control line 203 through the delay circuit 202, after the SLPWK signal is received by the first input of the delay circuit 202, the wakeup switches (e.g., W00, W01, W02, . . . , and W09) for the virtual power line VDDHD[0] are changed to the closed state. Consequently, the virtual power line VDDHD[0] is conductively connected to the power nodes for the supply voltage VDD through the wakeup switches (e.g., W00, W01, W02, . . . , and W09), enabling the MIOs 207 and the MCTRL 205 to obtain the power connections.

After a delay from the time at which the switch-on signal is applied to the control line 203, the switch-on signal is transmitted through the delay circuit 204 to the first input of the delay circuit 212. After a further delay caused by the delay circuit 212, the switch-on signal is applied to the control line 213 and transmitted to the gate terminals of the wakeup switches (e.g., W10, W11, W12, . . . , and W19) for the virtual power line VDDHD[1]. The switch-on signal at the gate terminals causes the wakeup switches (e.g., W10, W11, W12, . . . , and W19) for the virtual power line VDDHD[1] be changed to the closed state, and as a consequence, the virtual power line VDDHD[1] is conductively connected to the power nodes for the supply voltage VDD through the wakeup switches (e.g., W10, W11, W12, . . . , and W19), enabling the LIOs 217, the WLDRV 118, and the corresponding LCTRL 215 to obtain the power connections.

The delay time between the time at which the switch-on signal is applied to the control line 203 and the time at which the switch-on signal is applied to the control line 213 is selected to reduce the total peak current. The selected delay time depends upon both the current I-HD[0] flowing into the virtual power line VDDHD[0] and the current I-HD[1] flowing into the virtual power line VDDHD[1]. In some embodiments, the delay time is selected to be a minimal delay time possible that satisfies the criteria that the peak value due to the sum of the current I-HD[0] and I-HD[1] is less than a predetermined current value. In some embodiments, the predetermined current value is less than or equal to a read or write peak current, which is designed based on the consideration about the System-On-Chip (SOC) power management capacity. In some embodiments, the predetermined current value is 120% of the peak value of the current I-HD[0] or 120% of the peak value of the current I-HD[1].

Similarly, after a delay from the time at which the switch-on signal is applied to the control line 213, the switch-on signal is transmitted through the delay circuit 214 to the first input of the delay circuit 222. After a further delay caused by the delay circuit 222, the switch-on signal is applied to the control line 223 and transmitted to the gate terminals of the wakeup switches (e.g., W20, W21, W22, . . . , and W29) for the virtual power line VDDHD[2]. The switch-on signal at the gate terminals causes the wakeup switches (e.g., W20, W21, W22, . . . , and W29) for the virtual power line VDDHD[2] be changed to the closed state, and as a consequence, the virtual power line VDDHD [2] is conductively connected to the power nodes for the supply voltage VDD through the wakeup switches (e.g., W20, W21, W22, . . . , and W29), enabling the LIOs 227, the WLDRV 128, and the corresponding LCTRL 225 to obtain the power connections. The delay time between the time at which the switch-on signal is applied to the control line 213 and the time at which the switch-on signal is applied to the control line 223 is selected to reduce the total peak current.

After a delay from the time at which the switch-on signal is applied to the control line 223, the switch-on signal is transmitted through the delay circuit 224 to the input of the wakeup detector 250. The wakeup detector 250 is designed to generate a trigger signal SLPWK_TRK, when the voltage levels on the virtual power lines VDDHD[0], VDDHD[1], and VDDHD[2] are above a predetermined voltage level. In FIG. 2, the wakeup detector 250 detects the voltage level on the virtual power line VDDHD[2]. After the wakeup detector 250 receives the SLPWK_D signal from the output of the delay circuit 244, if the voltage level on the virtual power line VDDHD[2] is above the predetermined voltage level, the trigger signal SLPWK_TRK is generated at the output and transmitted to the first inputs of the delay circuits 208, 218, and 228.

After the first inputs of the delay circuits 208, 218, and 228 receive the trigger signal SLPWK_TRK, switch-on signals are applied to the control lines 209, 219, and 229 by the corresponding delay circuits 208, 218, and 228. The switch-on signals applied to the control lines 209, 219, and 229 to drive all function switches into the closed states. The function switches that are changed to the closed states include the function switches (e.g., T00, F00, F01, F02, . . . , and F09) for the virtual power line VDDHD[0], the function switches (e.g., T10, F10, F11, F12, . . . , and F19) for the virtual power line VDDHD[1], and the function switches (e.g., T20, F20, F21, F22, . . . , and F29) for the virtual power line VDDHD[2]. At the time at which the switch-on signals are applied to the gates terminals of the function switches, the voltage levels on the virtual power lines VDDHD[0], VDDHD[1], and VDDHD[2] are all above a predetermined voltage level, based on the trigger signal SLPWK_TRK from the wakeup detector 250. After the function switches are driven into the closed state, the IR-drop between the pull-up power supply VDD and the virtual power lines (e.g., VDDHD[0], VDDHD[1], or VDDHD[2]) are reduced, because the function switches in the closed state reduce the resistivity of the current paths from the pull-up power supply VDD to the virtual power lines.

Starting from the time at which the switch-on signals are applied to the gates terminals of the function switches, the voltage levels on the virtual power lines VDDHD[0], VDDHD[1], and VDDHD[2] are brought further towards the final voltage levels designed for the virtual power lines VDDHD[0], VDDHD[1], and VDDHD[2]. The total current flowing from the pull-up power supply VDD to the virtual power lines depends upon the difference between the final voltage levels and the voltage levels on the virtual power lines at the time at which the switch-on signals are applied. The smaller the difference between the final voltage levels and the voltage levels on the virtual power lines, the smaller the total current. On the other hand, reducing the difference between the final voltage levels and the voltage levels on the virtual power lines by relying on the current path established by the wakeup switches (e.g., W00-W09, W10-W19, and W20-W29) increases the time required for the memory device to wake up from a sleep mode. The wakeup detector 250 is implemented to set the optimized voltage levels on the virtual power lines at the time at which the switch-on signals are applied. The optimized voltage levels on the virtual power lines at the time at which the switch-on signals are applied are designed to be close to the final voltage levels to limit the total current flowing from the pull-up power supply VDD to the virtual power lines, balanced against the need to reduce the wake up time of the memory device.

In FIG. 2, when each of the virtual power lines (e.g., VDDHD[0], VDDHD[1], or VDDHD[2]) is sequentially turned on after a corresponding delay time, the VDD voltage will be applied to the virtual power lines. In some embodiments, the VDD voltage is applied to each virtual power line sequentially after the corresponding delay time. In some alternative embodiments, however, the VDD voltage is applied to two or more virtual power lines together as a group, even though each of the virtual power lines is sequentially turned on after a corresponding delay time. For example, when all of the virtual power lines VDDHD[0], VDDHD[1], and VDDHD[2] are conductively connected, the VDD voltage is applied to all of the virtual power lines together as a group. As another example, when the virtual power lines VDDHD[1] and VDDHD[2] are conductively connected together as a group, the VDD voltage is applied to the virtual power line VDDHD[0] before the VDD voltage is applied to both of the virtual power lines VDDHD [1] and VDDHD[2]. In some embodiments, all or some of the virtual power lines are conductively connected together to reduce the IR-drop caused by the read and/or write operations on the memory banks.

In FIG. 3, the control signal SLP controls whether the memory banks are set to the sleep mode or set to the operation mode. In operation, when the control signal SLP is changed from logic HIGH to logic LOW for changing the memory banks from the sleep mode to the operation mode, the control signal SLPD at the output of the OR-gate 320 in FIG. 3 is correspondingly changed from logic HIGH to logic LOW and coupled to the second control input 201 of the power management circuit 200. When the memory banks are in the sleep mode, the virtual power lines VDDAI in the power management circuit 100 remains turned on while the virtual power lines VDDHD in the power management circuit 200 are turned off. In some embodiments, when the memory banks are in the sleep mode, the control signal SD is maintained at logic LOW, and the SLPWK signal from the control output 109 of the power management circuit 100 in FIG. 3 is set to logic LOW and coupled to the first control input 261 of the power management circuit 200.

In FIG. 2, when the memory banks are waking up from the sleep mode, because the first control input 261 of the power management circuit 200 is maintained at logic LOW by the SLPWK signal from the control output 109 of the power management circuit 100, the first inputs of the delay circuits 202, 212, and 222 are maintained at logic LOW. When the memory banks are waking up from the sleep mode, the control signal SLPD received at the second control input 201 of the power management circuit 200 is changed from logic HIGH to logic LOW to indicate a change from a VDDHD-down state to a VDDHD-up state. Because of the control signal SLPD (with logic LOW) received at the second control input 201, the VDDHD-up signals (with logic LOW) are applied to the second inputs of the delay circuits 202, 212, 222, 208, 218, and 228. Because the first inputs of the delay circuits 202, 212, and 222 are maintained at logic LOW by the SLPWK signal and because the VDDHD-up signals (with logic LOW) are applied to the second inputs of the delay circuits 202, 212, and 222, switch-on signals are applied to the control lines 203, 213, and 223 correspondingly from the outputs of the delay circuits 202, 212, and 222. The switch-on signals on the control lines 203, 213, and 223 are correspondingly transmitted to the gate terminals of the wakeup switches (e.g., W00-W09), the gate terminals of the wakeup switches (e.g., W10-W19), and the gate terminals of the wakeup switches (e.g., W20-W29). Then, the virtual power lines (VDDHD[0], VDDHD[1], and VDDHD[2]) are tuned on by the wakeup switches (e.g., W00-W09, W10-W19, and W20-W29).

When the voltage levels on the virtual power lines VDDHD[0], VDDHD[1], and VDDHD[2] are above a predetermined voltage level, the wakeup detector 250 generates a trigger signal SLPWK_TRK. After the first inputs of the delay circuits 208, 218, and 228 receive the trigger signal SLPWK_TRK, switch-on signals are applied to the control lines 209, 219, and 229 by the corresponding delay circuits 208, 218, and 228. The switch-on signals on the control lines 209, 219, and 229 drive all function switches into the closed states. The function switches that are changed to the closed states include the function switches (e.g., T00 and F00-F09) for the virtual power line VDDHD[0], the function switches (e.g., T10 and F10-F19) for the virtual power line VDDHD[1], and the function switches (e.g., T20 and F20-F29) for the virtual power line VDDHD[2].

FIG. 4A is a diagram of a floor plan of a portion of function blocks in an SRAM, in accordance with some embodiments. The function blocks of the SRAM in FIG. 4A include the memory banks (e.g., 110, 120, 130, and 140), the LIOs 217 and the associated LCTRL 215, the LIOs 227 and the associated LCTRL 225, the MIOs 207 and the MCTRL 205, and the WLDRVs (e.g., 118, 128, 138, and 148). The LIOs 217 are coupled to both the memory bank 110 and the memory bank 120. The LIOs 227 are coupled to both the memory bank 130 and the memory bank 140. In FIG. 4A, the memory banks 110, 120, 130, and 140 are correspondingly powered from the virtual power lines VDDAI[1], VDDAI[2], VDDAI[3], and VDDAI[4]. A power management circuit, in accordance with some embodiments, for providing power to the memory banks (e.g., 110, 120, 130, and 140) is shown in FIG. 1.

In FIG. 4A, the MIOs 207 and the MCTRL 205 are powered from the virtual power line VDDHD[0]. The LIOs 217, the LCTRL 215, and the WLDRVs 118 & 128 are powered from the virtual power line VDDHD[1]. The LIOs 227, the LCTRL 225, and the WLDRVs 138 & 148 are powered from the virtual power line VDDHD[2]. A power management circuit, in accordance with some embodiments, for providing the power to various control circuits (e.g., the LIOs 217-227, the LCTRL 215-225, the MIOs 207, and the MCTRL 205) and the WLDRVs (e.g., 118 and 128) is shown in FIG. 2.

FIG. 4B is a high level diagram of a floor plan of a portion of function blocks in another SRAM, in accordance with some embodiments. The function blocks of the SRAM in FIG. 4B include the memory banks (e.g., 110 and 120), the LIOs 217 and the associated LCTRL 215, the LIOs 227 and the associated LCTRL 225, the MIOs 207 and the MCTRL 205, and the WLDRVs 118 & 128. The LIOs 217 are coupled to the memory bank 110, and the LIOs 227 are coupled to the memory bank 120. In FIG. 4A, the MIOs 207 and the MCTRL 205 are powered from the virtual power line VDDHD[0]. The LIOs 217, the LCTRL 215, and the WLDRV 118 are powered from the virtual power line VDDHD[1]. The LIOs 227, the LCTRL 225, and the WLDRV 128 are powered from the virtual power line VDDHD[2].

Figure 5:
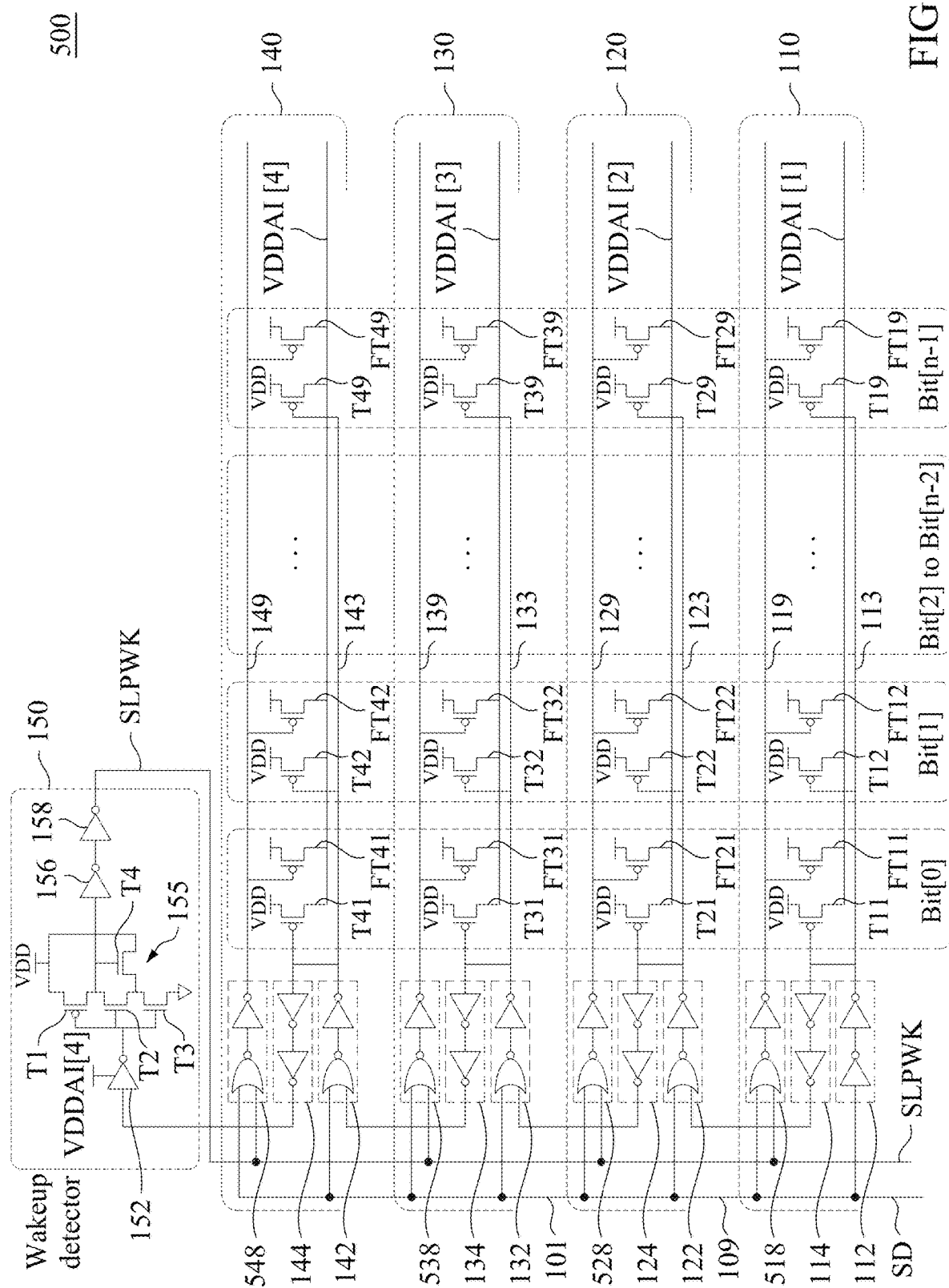
FIG. 5 is a schematic diagram of a part of a modified power management circuit having virtual power lines to power the memory cells in a memory device, in accordance with some embodiments.

FIG. 5 is a schematic diagram of a part of a power management circuit 500 modified from the power management circuit 100 of FIG. 1, in accordance with some embodiments. The modification includes adding function switches between the virtual power lines and the supply voltage VDD and adding delay circuits (e.g., 518-548) between the wakeup detector 150 and the gates of the function switches. The output of the wakeup detector 150 is coupled to the first inputs of the delay circuits 518-548. The second inputs of the delay circuits 518-548 are coupled to the control input 101 of the power management circuit 100.

In FIG. 5, a first array of function switches (e.g., FT11, FT12, . . . , and FT19) is placed between the virtual power line VDDAI[1] and the supply voltage VDD. A second array of function switches (e.g., FT21, FT22, . . . , and FT29) is placed between the virtual power line VDDAI[2] and the supply voltage VDD. A third array of function switches (e.g., FT31, FT32, . . . , and FT39) is placed between the virtual power line VDDAI[3] and the supply voltage VDD. A fourth array of function switches (e.g., FT41, FT42, . . . , and FT49) is placed between the virtual power line VDDAI[4] and the supply voltage VDD. In FIG. 5, the function switches are implemented as transistor switches such as FET switches.

The gate terminals of the function switches (e.g., FT11-FT19) for the virtual power line VDDAI[1] are connected to a control line 119 and coupled to the output of the delay circuit 518. The gate terminals of the function switches (e.g., FT21-FT29) for the virtual power line VDDAI[2] are connected to a control line 129 and coupled to the output of the delay circuit 528. The gate terminals of the function switches (e.g., FT31-FT39) for the virtual power line VDDAI[3] are connected to a control line 139 and coupled to the output of the delay circuit 538. The gate terminals of the function switches (e.g., FT41-FT49) for the virtual power line VDDAI[4] are connected to a control line 149 and coupled to the output of the delay circuit 548.

In operation, when a control signal SD (with logic LOW) on the control input 101 indicates a change from a VDDAI-down state to a VDDAI-up state, each of the virtual power lines (e.g., VDDAI[1], VDDAI[2], VDDAI[3], or VDDAI[4]) is sequentially connected to the supply voltage VDD, after a corresponding delay time (e.g., Δt[12], Δt[23], or Δt[34]), through the wakeup switches (e.g., T11-T19, T21-T29, T31-T39, and T41-T49). When the voltage levels on the virtual power lines (e.g., VDDAI[1], VDDAI[2], VDDAI[3], and VDDAI[4]) reach the levels as designed, a trigger signal SLPWK (with logic LOW) is generated at the output of the wakeup detector 150 and coupled to the first inputs of the delay circuits 518-548. In response to the trigger signal SLPWK, the switch-on signals (with logic LOW) are generated at the outputs of the delay circuits 518-548. The switch-on signals are applied to the control lines 119, 129, 139, and 149 to drive all function switches (e.g., FT11-T19, FT21-T29, FT31-FT39, and FT41-FT49) into the closed states. When the function switches are driven into the closed states, the IR-drops between the pull-up power supply VDD and the virtual power lines (e.g., VDDAI[1], VDDAI[2], VDDAI[3], and VDDAI[4]) are reduced.

The arrangement and the connections of the wakeup switches and the function switches of the power management circuit 200 in FIG. 2 have different variations. Some of the variations are shown in FIG. 6 and FIGS. 7A-7B.

Figure 6:
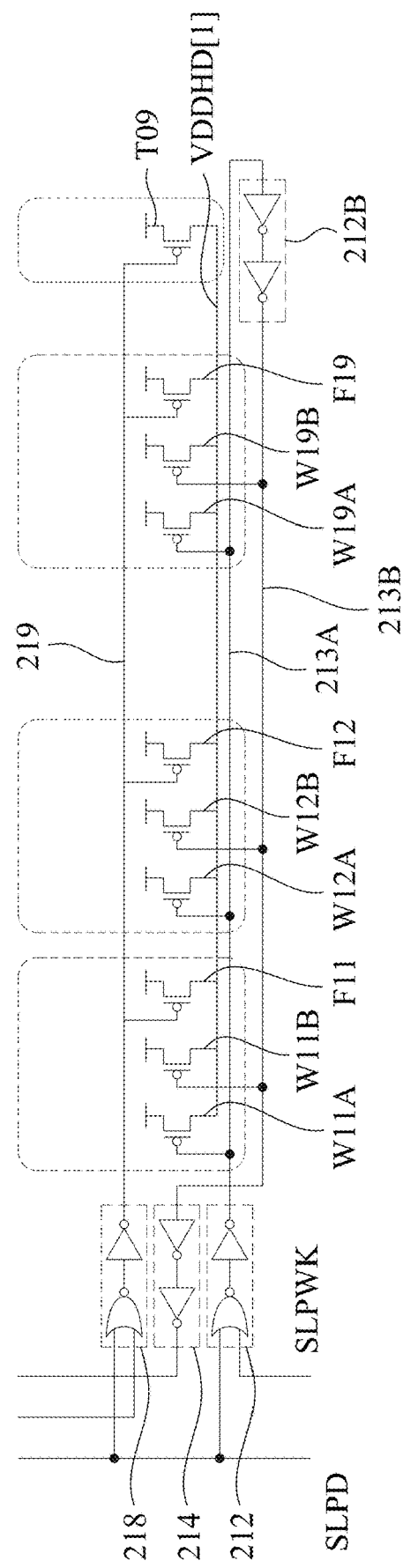
FIG. 6 is a schematic diagram of an implementation of the wakeup switches and the function switches for managing the power connections to a virtual power line, in accordance with some embodiments.

FIG. 6 is a schematic diagram of an implementation of the wakeup switches and the function switches for managing the power connections to a virtual power line, in accordance with some embodiments. The wakeup switches for the virtual power line VDDHD[1] are divided into two groups. Each group of the wakeup switches is controlled by one of the control lines 213A and 213B. The gate terminals of the wakeup switches (e.g., W10A, W11A, W12A, . . . , and W19A) in the first group are connected to the control line 213A and coupled to the output of the delay circuit 212 and the input of the delay circuit 212B. The gate terminals of the wakeup switches (e.g., W10B, W11B, W12B, . . . , and W19B) in the second group are connected to the control line 213B and coupled to the output of the delay circuit 212B and the input of the delay circuit 214. The gate terminals of the function switches (e.g., T10, F10, F11, F12, . . . , and F19) for the virtual power line VDDHD[1] are connected to a control line 219 and coupled to the output of the delay circuit 218.

In operation, when the input of the delay circuit 212 receives a switch-on signal, the switch-on signal is applied to the control line 213A and causes the wakeup switches (e.g., W10A, W11A, W12A, . . . , and W19A) in the first group to be changed to the closed state. After a delay from the time at which the switch-on signal is applied to the control line 213A, the switch-on signal is transmitted through the delay circuit 212B to the control line 213B. The switch-on signal causes the wakeup switches (e.g., W10B, W11B, W12B, . . . , and W19B) in the second group to be changed to the closed state. The switch-on signal on the control line 213B is received by the input of the delay circuit 214 and transmitted to the control line for the next stage wakeup switches for controlling the power connections of the virtual power line in the next stage.

Figure 7A:
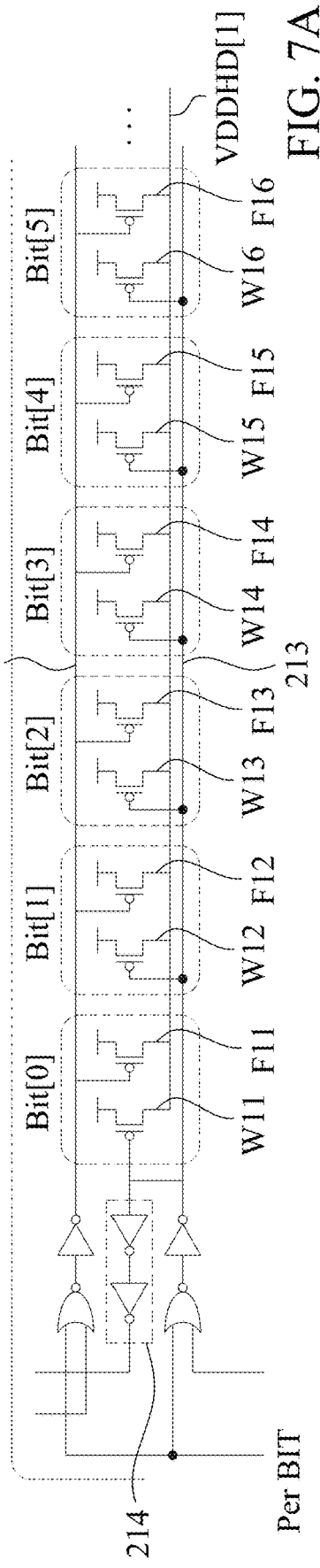
FIGS. 7A-7C are schematic diagrams of various implementations of the wakeup switches and the function switches for managing the power connections to a virtual power line, in accordance with some embodiments.
Figure 7B:
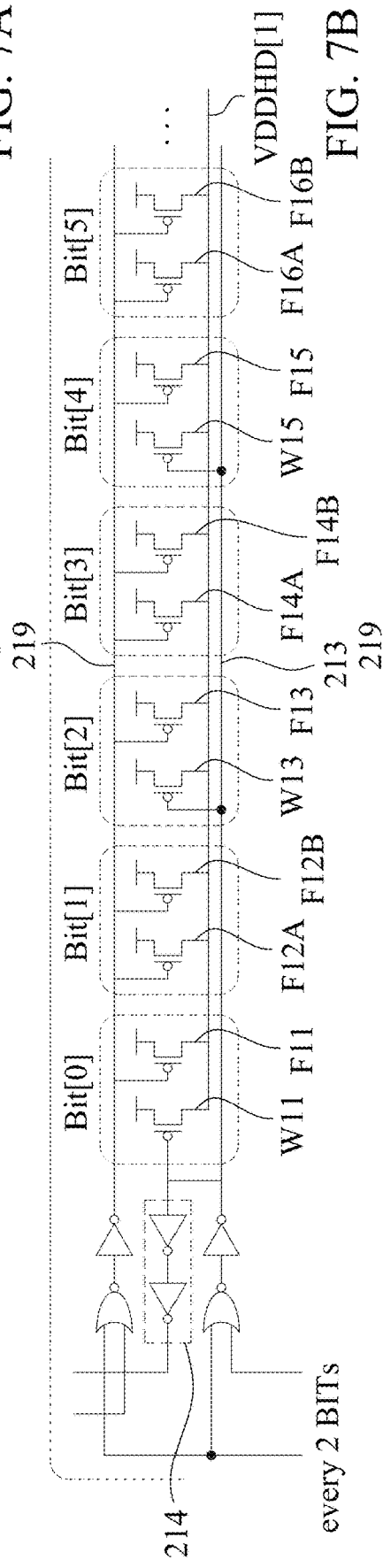
Figure 7C:
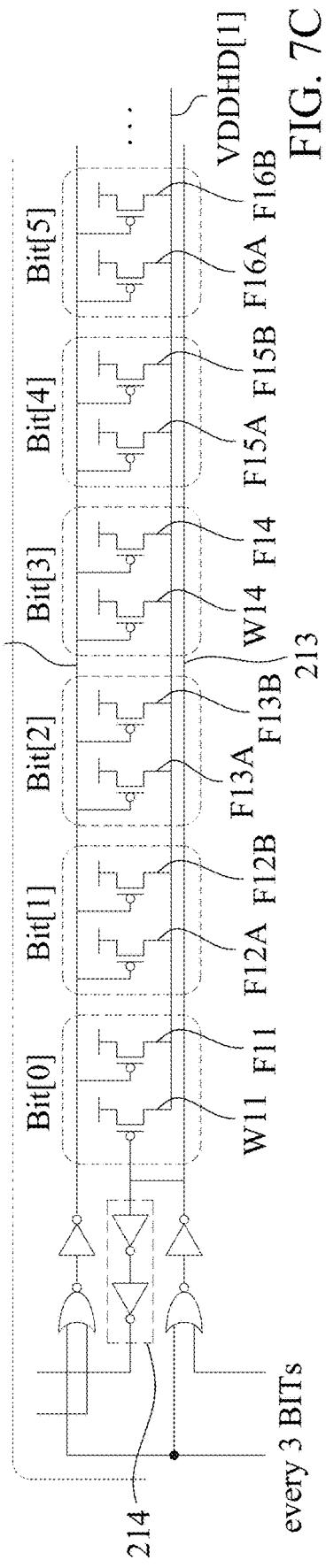

FIGS. 7A-7C are schematic diagrams of various implementations of the wakeup switches and the function switches for managing the power connections to a virtual power line, in accordance with some embodiments. In FIGS. 7A-7C, the gate terminals of the wakeup switches for the virtual power line VDDHD[1] are connected to the control line 213 and coupled to both the output of the delay circuit 212 and the first input of the delay circuit 214. The gate terminals of the function switches (e.g., T10, F10, F11, F12, . . . , and F19) for the virtual power line VDDHD[1] are connected to the control line 219 and coupled to the output of the delay circuit 218.

In FIG. 7A, each LIO is associated with one wakeup switch and one function switch. For example, the LIOs for bit[0], bit[1], bit[2], bit[3], bit[4], and bit[5] are correspondingly associated with wakeup switches W11, W12, W13, W14, W15, and W16. The LIOs for bit[0], bit[1], bit[2], bit[3], bit[4], and bit[5] are also correspondingly associated with function switches W11, F12, F13, F14, F15, and F16.

In FIG. 7B, every one out of two LIOs is associated with one wakeup switch and one function switch. Each of the remaining LIOs is associated with two function switches. For example, the LIOs for bit[0], bit[2], and bit[4] are correspondingly associated with wakeup switches W11, W13, and W15. The LIOs for bit[0], bit[2], and bit[4] are also correspondingly associated with function switches F11, F13, and F15. The LIO for bit[1] is associated with function switches F12A and F12B. The LIO for bit[3] is associated with function switches F14A and F14B. The LIO for bit[5] is associated with function switches F16A and F16B.

In FIG. 7C, every one out of three LIOs is associated with one wakeup switch and one function switch. Each of the remaining LIOs is associated with two function switches. For example, the LIOs for bit[0] and bit[3] are correspondingly associated with wakeup switches W11 and W14. The LIOs for bit[0] and bit[3] are also correspondingly associated with function switches F11 and F14. The LIO for bit[1] is associated with function switches F12A and F12B. The LIO for bit[2] is associated with function switches F13A and F13B. The LIO for bit[4] is associated with function switches F15A and F15B. The LIO for bit[5] is associated with function switches F16A and F16B.

Figure 8A:
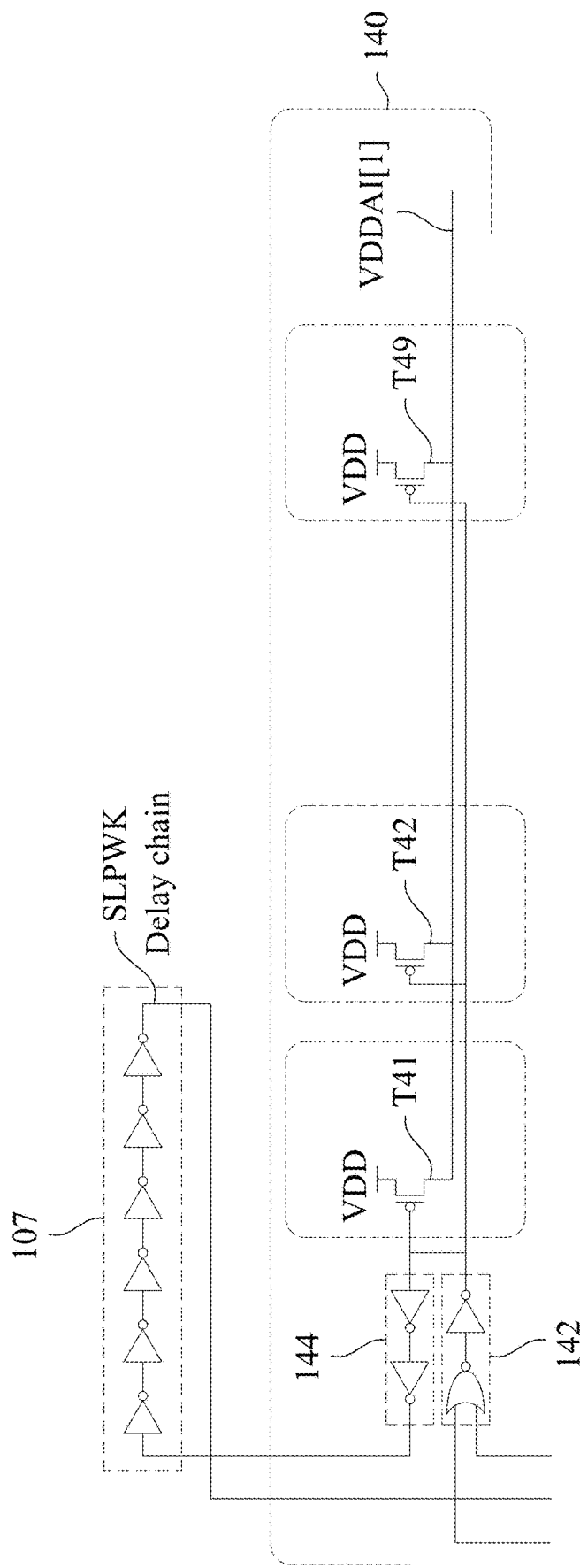
FIG. 8A is a schematic diagram of another implementation of the wakeup detector of FIG. 1 in the power management circuit for managing power connections to the memory cells in a memory device, in accordance with some embodiments.

The wakeup detectors in the power management circuits in FIG. 1 and FIG. 2 have different variations. FIG. 8A is a schematic diagram of another implementation of the wakeup detector 150 in the power management circuit for managing power connections to the memory cells in a memory device, in accordance with some embodiments. The wakeup detector 150 in FIG. 8A is implemented as a daisy chain of inverters with a predetermined delay time based on design needs. In FIG. 8A, when a switch-on signal is received by the input of the wakeup detector 150 from the delay circuit 144, a SLPWK signal is generated at the output of the wakeup detector 150 after a predetermined delay time period. In some embodiments, the SLPWK signal is received by the first input of the delay circuit 202 in the power management circuit of FIG. 2, which starts the power connection processes of various control circuits in a memory device.

Figure 8B:
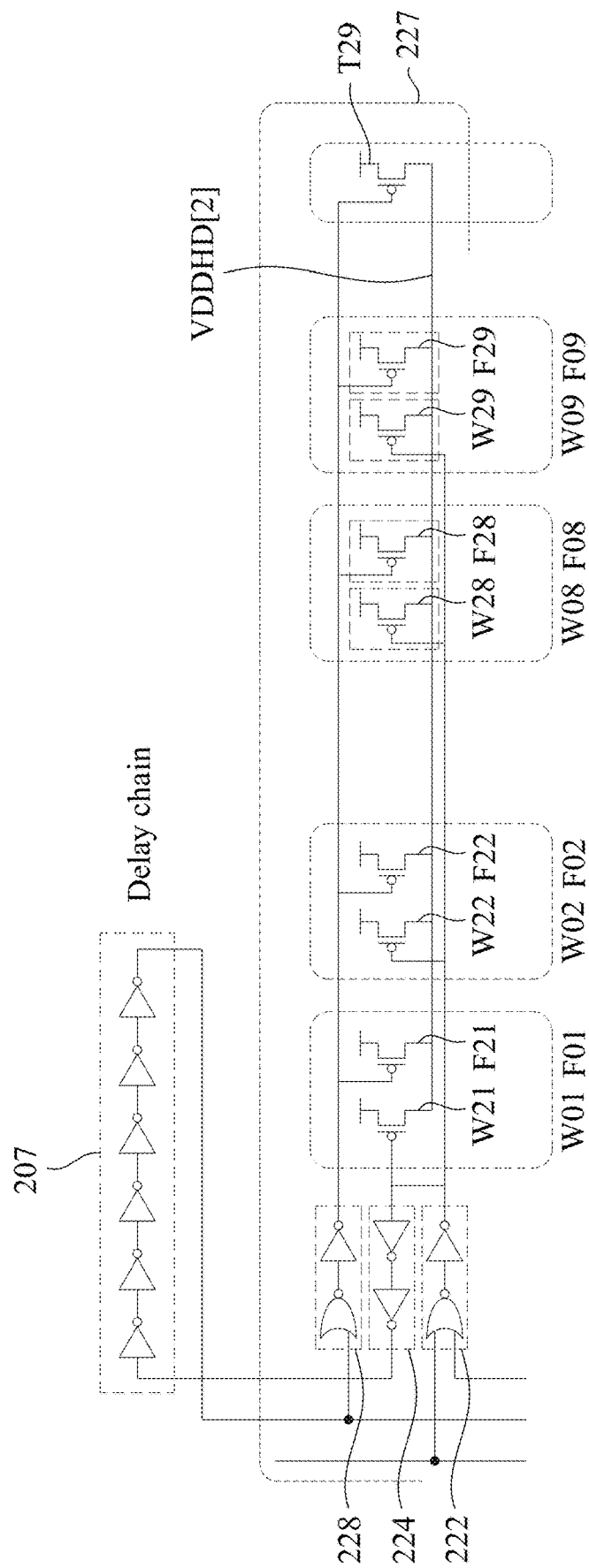
FIG. 8B is a schematic diagram of another implementation of the wakeup detector of FIG. 2 in the power management circuit for managing power connections to various control circuits in a memory device, in accordance with some embodiments.

FIG. 8B is a schematic diagram of another implementation of the wakeup detector 250 in the power management circuit for managing power connections to various control circuits in a memory device, in accordance with some embodiments. The wakeup detector 250 in FIG. 8B is implemented as a daisy chain of inverters with a predetermined delay time based on design needs. In FIG. 8B, when a switch-on signal is received by the input of the wakeup detector 250 from the delay circuit 224, a SLPWK_TRK signal is generated at the output of the wakeup detector 250 after a predetermined delay time period. In some embodiments, the SLPWK_TRK signal is transmitted to the first inputs of the delay circuits 208, 218, and 228 in the power management circuit of FIG. 2, which starts the processes of turning on the function switches for the virtual power line VDDHD[0], VDDHD[1], and VDDHD[2].

Figure 9:
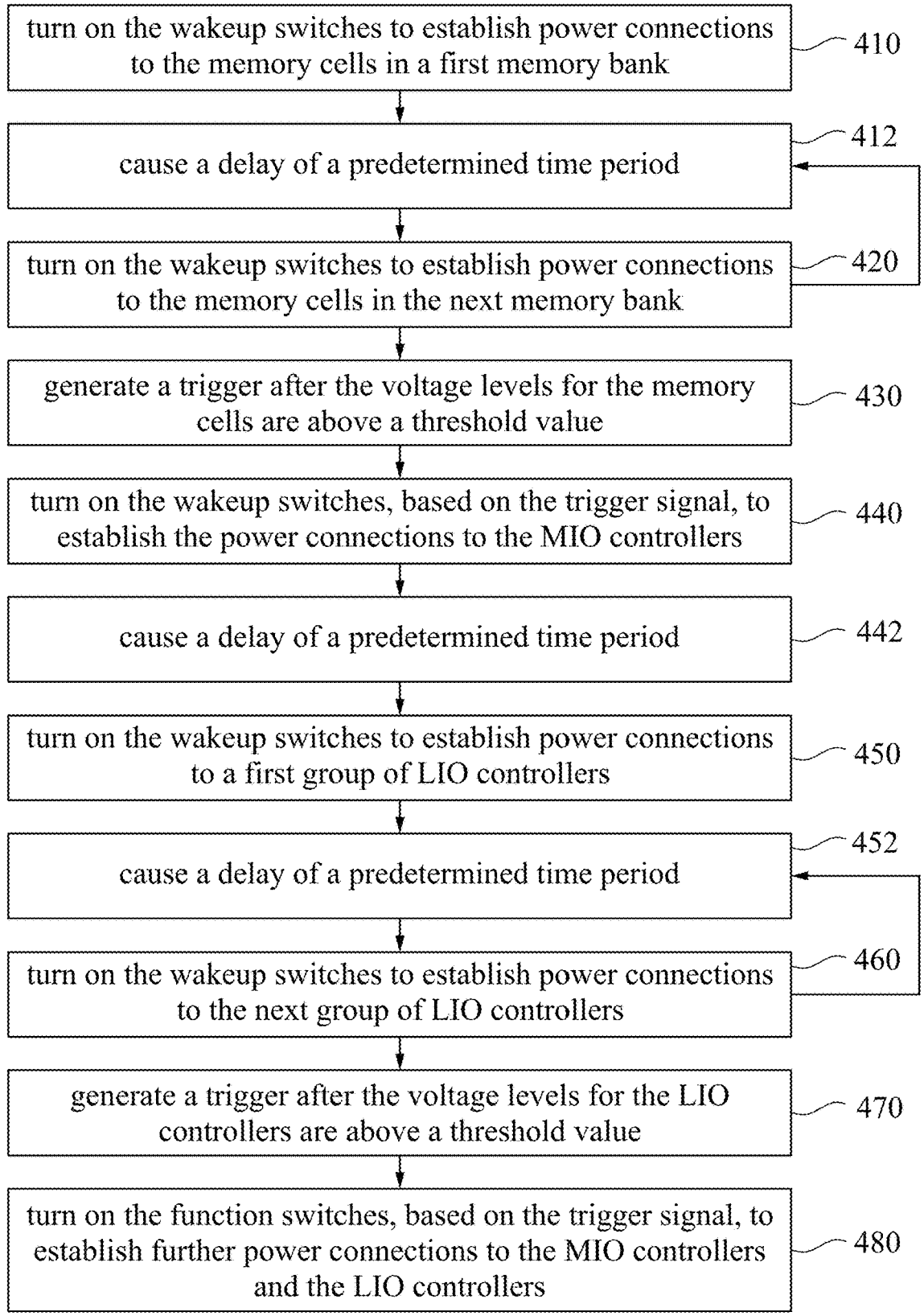
FIG. 9 is a flowchart of a method of activating a memory device, in accordance with some embodiments.

FIG. 9 is a flowchart of a method of activating a memory device, in accordance with some embodiments. At operation 410, the wakeup switches are turned on to establish power connections to the memory cells in a first memory bank. In the embodiment of FIG. 1, the wakeup switches (e.g., T11, T12, . . . , and T19) for the virtual-power line VDDAI[1] are turned on to establish power connections to the memory cells in the first memory bank 110. In FIG. 1, the memory cells in the first memory bank 110 take power from the virtual-power line VDDAI[1], after the virtual-power line VDDAI[1] is connected to the VDD power supply through the wakeup switches. In FIG. 1, the wakeup switches are implemented as header switches between the virtual-power line VDDAI[1] and the pull-up power supply VDD. In some alternative embodiments, power connections to the memory cells are established by turning on wakeup switches that are implemented as footer switches between a virtual-power line (e.g., VSSAI[1]) and the pull-down power supply VSS. In still some alternative embodiments, power connections to the memory cells are established by turning on both the header switches and the footer switches. In some embodiments, the footer switches are implemented as transistor switches such as FET switches In FIG. 9, after a delay of a predetermined time period at operation 412, at operation 420, the wakeup switches are turned on to establish power connections to the memory cells in the next memory bank. For example, in the embodiment of FIG. 1, after a delay of a predetermined time period since the switch-on signals are applied to the gates of the wakeup switches (e.g., T11, T12, and T19) for the virtual-power line VDDAI[1], the wakeup switches (e.g., T21, T22, . . . , and T29) for the virtual-power line VDDAI[2] are turned on to establish power connections to the memory cells in the next memory bank 120.

In FIG. 9, the operations at 412 and 420 are repeated until the wakeup switches are turned on for all memory banks. Then, at operation 430, a trigger signal is generated when the voltage levels for the memory cells are above a threshold value. For example, in the embodiment of FIG. 1, after the wakeup switches are turned on to establish power connections to the memory cells in all memory banks (e.g., 110, 120, 130, and 140), a trigger signal SLPWK is generated at the output of the wakeup detector 150 when the voltage levels on the virtual-power lines are above a predetermined level.

In FIG. 9, at operation 440, based on the trigger signal, the wakeup switches are turned on to start the power connections to the MIO controllers. In some embodiments, at operation 440, the wakeup switches are turned on to start the power connections to both the MIO controllers and main control circuit (MCTRL). For example, in the embodiment of FIG. 2, based on the SLPWK signal received by the delay circuit 202, wakeup switches (e.g., W00, W01, W02, . . . , and W09) for the virtual power line VDDHD[0] are turned on, and the power connections to the MIO 207 and the MCTRL 205 are established. In FIG. 9, after a delay of a predetermined time period at operation 442, the wakeup switches are turned on at operation 450 to establish power connections to a first group of LIO controllers. In some embodiments, the wakeup switches are turned on at operation 450 to establish power connections to the first group of LIO controllers and the corresponding local control circuit (LCTRL). In some embodiments, the wakeup switches are turned on at operation 450 to establish power connections to the first group of LIO controllers, the corresponding local control circuit (LCTRL), and the corresponding word-line driver (WLDRV). In the embodiment of FIG. 2, after a delay time caused by the delay circuits 204 and 212, the wakeup switches (e.g., W10, W11, W12, . . . , and W19) for the virtual-power line VDDHD[1] are turned on to establish power connections to the LIO controllers 217, the WLDRV 118, and the corresponding LCTRL 215.

In FIG. 9, after a delay of a predetermined time period at operation 452, at operation 460, the wakeup switches are turned on to establish power connections to the next group of LIO controllers. In some embodiments, at operation 460, the wakeup switches are turned on to establish power connections to the next group of LIO controllers and the corresponding local control circuit (LCTRL). In some embodiments, at operation 460, the wakeup switches are turned on to establish power connections to the next group of LIO controllers, the corresponding local control circuit (LCTRL), and the corresponding word-line driver (WLDRV). In the embodiment of FIG. 2, after a delay time caused by the delay circuits 214 and 222, the wakeup switches (e.g., W20, W21, W22, . . . , and W29) for the virtual-power line VDDHD[2] are turned on to establish power connections to the LIO controllers 227, the WLDRV 128, and the corresponding LCTRL 225. The operations at 452 and 460 are repeated until the wakeup switches are turned on for all groups of LIO controllers. Then, at operation 470, a trigger signal is generated after the voltage levels for the LIO controllers are above a threshold value. In the embodiment of FIG. 2, a trigger signal SLPWK_TRK is generated by the wakeup detector 250, when the voltage levels on the virtual-power lines VDDHD[0], VDDHD[1], and VDDHD[2] are above a predetermined voltage level.

In FIG. 9, after the trigger is generated at operation 470, the function switches are turned on at operation 480 to establish further power connections to the MIO controllers and the LIO controllers. In some embodiments, the function switches are turned on at operation 480 to establish further power connections to the MIO controllers, the LIO controllers, the main control circuits (MCTRLs), the local control circuits (LCTRLs), and the word-line drivers (WLDRVs). In the embodiment of FIG. 2, after the trigger signal SLPWK_TRK is generated by the wakeup detector 250, the function switches for the virtual-power lines (e.g., VDDHD[0], VDDHD[1], and VDDHD[2]) are turned on to establish further power connections to the MIO controller 207, the LIO controllers 217 and 227, the LCTRLs 215 and 225, and WLDRVs 118 and 128. The function switches reduce the IR-drop between the virtual-power lines and the power supply VDD.

Figure 10A:
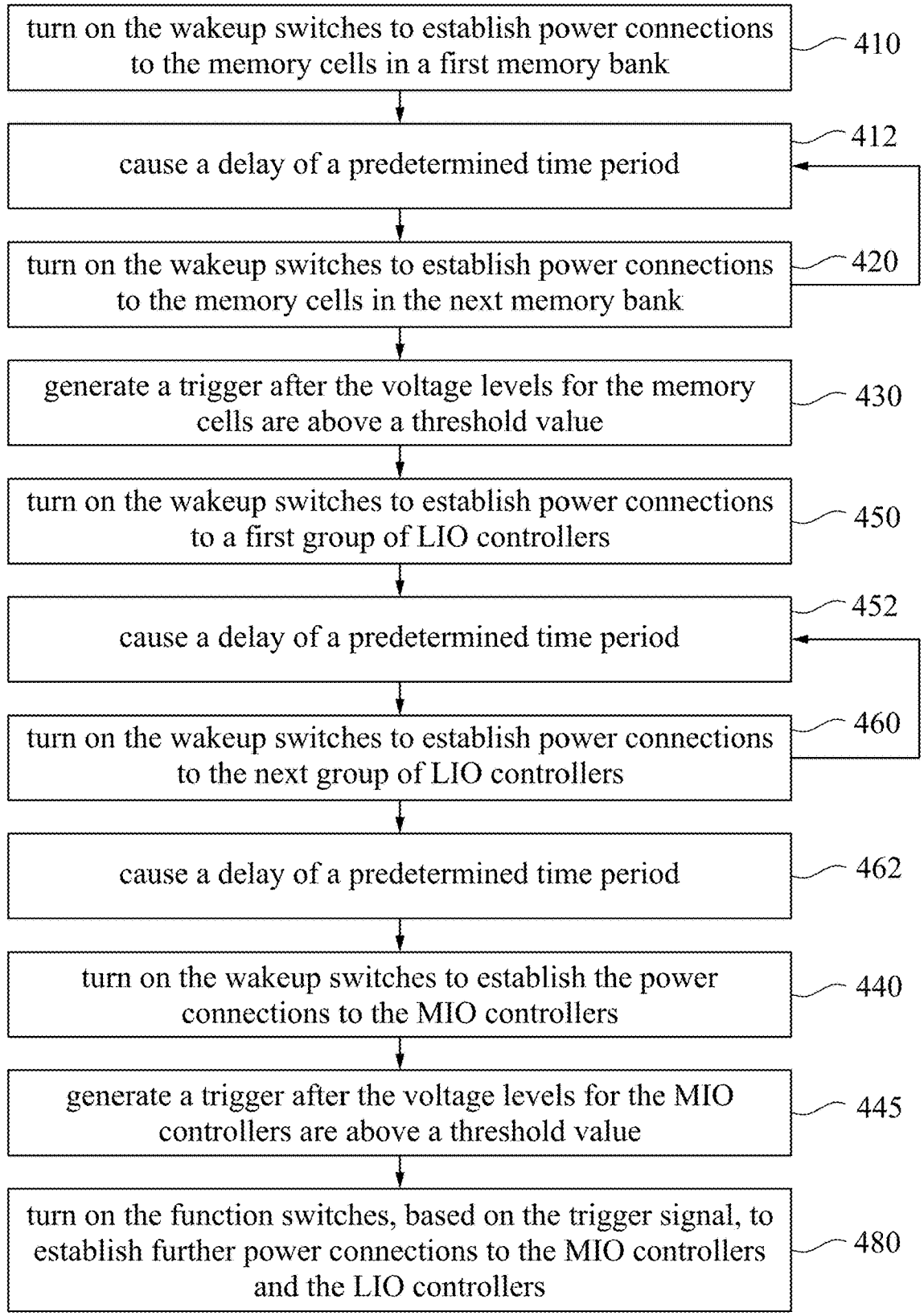
FIG. 10A is a flowchart of another method of activating a memory device, which is a variation of the method in FIG. 9, in accordance with some embodiments.
Figure 10B:
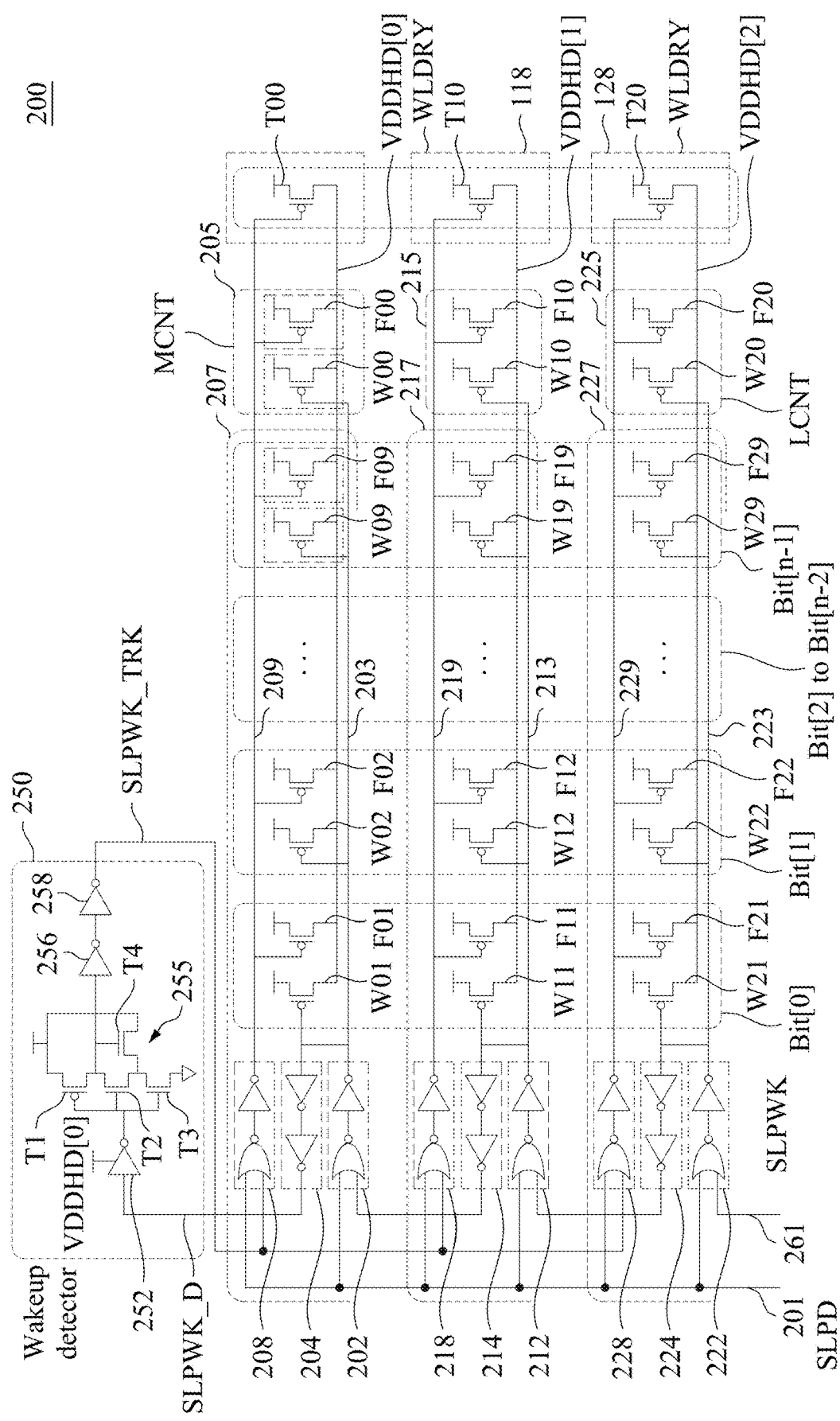
FIG. 10B is a schematic diagram of a part of a power management circuit which is a variation of the circuit in FIG. 2, in accordance with some embodiments.

FIG. 10A is a flowchart of another method of activating a memory device, which is a variation of the method in FIG. 9, in accordance with some embodiments. FIG. 10B is a schematic diagram of a part of a power management circuit implementing some of the operations in the flowchart of FIG. 10A, in accordance with some embodiments. In FIG. 10A, after a trigger signal is generated at operation 430, which indicates that the voltage levels for the memory cells are above a threshold value, the wakeup switches are turned on, at operation 450, to establish power connections to a first group of LIO controllers. After a delay of a predetermined time period at operation 452, at operation 460, the wakeup switches are turned on to establish power connections to the next group of LIO controllers. The operations at 452 and 460 are repeated until the wakeup switches are turned on for all groups of LIO controllers. Then, After a delay of a predetermined time period at operation 462, the wakeup switches are turned on at operation 440 to start the power connections to the MIO controllers.

In some embodiments, the wakeup switches are turned on, at operation 450, to establish power connections to the first group of LIO controllers and the corresponding local control circuit (LCTRL). In some embodiments, the wakeup switches are turned on, at operation 450, to establish power connections to the first group of LIO controllers, the corresponding local control circuit (LCTRL), and the corresponding word-line driver (WLDRV). In some embodiments, at operation 460, the wakeup switches are turned on to establish power connections to the next group of LIO controllers and the corresponding local control circuit (LCTRL). In some embodiments, at operation 460, the wakeup switches are turned on to establish power connections to the next group of LIO controllers, the corresponding local control circuit (LCTRL), and the corresponding word-line driver (WLDRV). In some embodiments, the wakeup switches are turned on at operation 440 to start the power connections to both the MIO controllers and main control circuit (MCTRL).

In the embodiment of FIG. 10B, after the SLPWK signal is received by the delay circuit 222, the wakeup switches (e.g., W20, W21, W22, . . . , and W29) for the virtual power line VDDHD[2] are turned on to establish power connections to the LIO controllers 227, the WLDRV 118, and the corresponding LCTRL 215. Then, after a delay time caused by the delay circuits 224 and 212, the wakeup switches (e.g., W10, W1, W12, . . . , and W19) for the virtual power line VDDHD[1] are turned on to establish power connections to the LIO controllers 217, the WLDRV 118, and the corresponding LCTRL 215. Next, after a delay time caused by the delay circuits 214 and 202, the wakeup switches (e.g., W00, W01, W02, . . . , and W09) for the virtual power line VDDHD[0] are turned on, and the power connections to the MIO 207 and the MCTRL 205 are established.

In FIG. 10A, at operation 445, a trigger is generated after the voltage levels for the MIO controllers are above a threshold value. Then, at operation 480, the function switches are turned on to establish further power connections to the MIO controllers and the LIO controllers. In the embodiment of FIG. 10B, after the trigger signal SLPWK_TRK is generated by the wakeup detector 250, the function switches for the virtual power lines (e.g., VDDHD [0], VDDHD[1], and VDDHD[2]) are turned on to establish further power connections to the MIO controller 207, the LIO controllers 217 and 227, the LCTRLs 215 and 225, and WLDRVs 118 and 128. The function switches reduce the IR drops between the virtual power lines and the power supply VDD.

One aspect of this description relates to a device. The device includes a first virtual power line in a first memory bank, a second virtual power line in a second memory bank, a first delay circuit, and a first wakeup detector. The first virtual power line is configured to be coupled to a power supply through a first group of transistor switches. The second virtual power line is configured to receive the power supply through a second group of transistor switches. The first delay circuit has a first input coupled to gate terminals of the first group of transistor switches and has a first output coupled to gate terminals in the second group of transistor switches. The first wakeup detector is configured to generate a first trigger signal after receiving a signal from the first output of the first delay circuit.

One aspect of this description relates to a device. The device includes a plurality of MIO controllers, a first group of LIO controllers, a wakeup detector, and a plurality of drivers. The plurality of MIO controllers is configured to be coupled to a power supply through a first group of wakeup switches and through a first group of function switches. The first group of LIO controllers is configured to be coupled to the power supply through a second group of wakeup switches and through a second group of function switches. The wakeup detector is configured to generate a trigger signal when voltages levels for powering the plurality of MIO controllers and the first group of LIO controllers reach a predetermine value. The plurality of drivers has driver outputs coupled to gate terminals in the first group of function switches and gate terminals in the second group of function switches, and the plurality of drivers has driver inputs configured to receive the trigger signal.

Still another aspect of this description relates to a method of activating a memory device. The memory device includes a plurality of main input-output (MIO) controllers, a plurality of local input-output (LIO) controllers, a plurality of wakeup switches, a plurality of function switches, and a plurality of memory banks. Each memory bank includes a plurality of memory cells. The method includes establishing power connections to the memory cells in a first memory bank, through the wakeup switches associated with the first memory bank. The method includes establishing power connections to the memory cells in a second memory bank, through the wakeup switches associated with the second memory bank, after a predetermined time period after establishing the power connections to the memory cells in the first memory bank. The method includes providing power connections to the MIO controllers and the LIO controllers, after finishing the power connections to the memory cells in the second memory bank.

It will be readily seen by one of ordinary skill in the art that one or more of the disclosed embodiments fulfill one or more of the advantages set forth above. After reading the foregoing specification, one of ordinary skill will be able to affect various changes, substitutions of equivalents and various other embodiments as broadly disclosed herein. It is therefore intended that the protection granted hereon be limited only by the definition contained in the appended claims and equivalents thereof.

What is claimed is:
1. A device comprising:
a first virtual power line, in a first memory bank, configured to be coupled to a power supply through a first group of transistor switches;
a second virtual power line, in a second memory bank, configured to receive the power supply through a second group of transistor switches;
a first delay circuit of the first memory bank having a first input coupled to gate terminals of the first group of transistor switches;
a first delay circuit of the second memory bank having a first input coupled to a first output of the first delay circuit of the first memory bank, the first output of the first delay circuit of the first memory bank coupled to gate terminals in the second group of transistor switches;
a second delay circuit of the second memory bank having a first input coupled to the gate terminals in the second group of transistor switches; and
a first wakeup detector configured to generate a first trigger signal after receiving a signal from a first output of the second delay circuit of the second memory bank.

2. The device of claim 1, wherein:
the first memory bank includes a first group of bitcells receiving power from the first virtual power line; and
the second memory bank includes a second group of bitcells receiving power from the second virtual power line.

3. The device of claim 1, wherein the power supply is a power rail.

4. The device of claim 1, further comprising:
a plurality of main input-output (MIO) controllers configured to be coupled to the power supply through a first group of wakeup switches and through a first group of function switches, wherein gate terminals in the first group of wakeup switches are configured to receive the first trigger signal; and
a first group of local input-output (LIO) controllers configured to be coupled to the power supply through a second group of wakeup switches and through a second group of function switches, and wherein gate terminals of the second group of wakeup switches are configured to receive a delayed signal from the gate terminals of the first group of wakeup switches through one or more stages of delay circuits.

5. The device of claim 4, further comprising:
a second wakeup detector having an input coupled to the gate terminals in the second group of wakeup switches in the first group of LIO controllers and configured to generate a second trigger signal; and
a plurality of drivers having driver inputs configured to receive the second trigger signal and having driver outputs coupled to gate terminals in the first group of function switches and gate terminals in the second group of function switches.

6. The device of claim 4, further comprising:
a second group of LIO controllers configured to be coupled to the power supply through a third group of wakeup switches and a third group of function switches; and
a second delay circuit having a second output coupled to the gate terminals in the third group of wakeup switches and having a second input coupled to the gate terminals in the second group of wakeup switches in the first group of LIO controllers.

7. The device of claim 1, further comprising:
a plurality of MIO controllers configured to be coupled to the power supply through a first group of wakeup switches and through a first group of function switches;
a first group of LIO controllers configured to be coupled to the power supply through a second group of wakeup switches and through a second group of function switches, wherein gate terminals in the second group of wakeup switches are configured to receive the first trigger signal; and
wherein gate terminals of the first group of wakeup switches are configured to receive a delayed signal from gate terminals of second group of wakeup switches through one or more stages of delay circuits.

8. The device of claim 7, further comprising:
a second wakeup detector coupled to the gate terminals in the first group of wakeup switches and configured to generated a second trigger signal; and
a plurality of drivers having driver inputs configured to receive the second trigger signal and having driver outputs coupled to the gate terminals in the first group of function switches and the gate terminals in the second group of function switches.

9. The device of claim 7, further comprising:
a second group of LIO controllers configured to be coupled to the power supply through a third group of wakeup switches and a third group of function switches; and
a second delay circuit having a second output coupled to the gate terminals in the third group of wakeup switches and having a second input coupled to the gate terminals in the second group of wakeup switches in the first group of LIO controllers.

10. A device comprising:
a plurality of MIO controllers configured to be coupled to a power supply through a first group of wakeup switches and through a first group of function switches;
a first group of LIO controllers configured to be coupled to the power supply through a second group of wakeup switches and through a second group of function switches;
a wakeup detector configured to generate a trigger signal when voltages levels for powering the plurality of MIO controllers and the first group of LIO controllers reach a predetermine value; and
a plurality of drivers having driver outputs coupled to gate terminals in the first group of function switches and gate terminals in the second group of function switches and having driver inputs configured to receive the trigger signal.

11. The device of claim 10, wherein the wakeup detector has an input coupled to the gate terminals in the second group of wakeup switches in the first group of LIO controllers.

12. The device of claim 11, further comprising:
a second group of LIO controllers configured to be coupled to the power supply through a third group of wakeup switches and a third group of function switches; and
a delay circuit having an output coupled to the gate terminals in the second group of wakeup switches in the first group of LIO controllers and having an input coupled to the gate terminals in the third group of wakeup switches in the first group of LIO controllers.

13. The device of claim 10, wherein the wakeup detector has an input coupled to the gate terminals in the first group of wakeup switches in the MIO controllers.

14. The device of claim 13, further comprising:
a delay circuit having an output coupled to the gate terminals in the first group of wakeup switches in the MIO controllers and having an input coupled to the gate terminals in the second group of wakeup switches in the first group of LIO controllers.

15. The device of claim 10, wherein the wakeup detector is a first wakeup detector, the device further comprising:
a second wakeup detector coupled to the gate terminals in the first group of wakeup switches and configured to generate a second trigger signal; and
a plurality of drivers having driver inputs configured to receive the second trigger signal and having driver outputs coupled to the gate terminals in the first group of function switches and the gate terminals in the second group of function switches.

16. A method of activating a memory device that includes a plurality of main input-output (MIO) controllers, a plurality of local input-output (LIO) controllers, a plurality of wakeup switches, a plurality of function switches, and a plurality of memory banks, wherein each memory bank includes a plurality of memory cells, the method comprising:

establishing power connections to the memory cells in a first memory bank, through the wakeup switches associated with the first memory bank;

establishing power connections to the memory cells in a second memory bank, through the wakeup switches associated with the second memory bank, after a predetermined time period after establishing the power connections to the memory cells in the first memory bank; and providing power connections to the MIO controllers and the LIO controllers, after finishing the power connections to the memory cells in the second memory bank, wherein:

establishing the power connections to a first group of LIO controllers, through the wakeup switches associated with the first group of LIO controllers, at a first time;

establishing the power connections to a second group of LIO controllers, through the wakeup switches associated with the second group of LIO controllers, at a second time; and establishing the power connections to the MIO controllers, through the wakeup switches associated with the MIO controllers, at a third time.

17. The method of claim 16, wherein establishing the power connection to a memory cell comprises turning on a transistor switch between a power supply node and a power bus that is conductively connected to the memory cell.

18. The method of claim 16, wherein providing the power connections to the MIO controller and the LIO controllers further comprises:

establishing further power connections, through the plurality of function switches, to the MIO controllers and to the first group of LIO controllers and the second group of LIO controllers, after finishing the power connections through the wakeup switches to the MIO controllers and to the first group of LIO controllers and the second group of LIO controllers.

19. The method of claim 16, further comprising:

establishing the power connections to the first group of LIO controllers based on a trigger signal that is generated after finishing the power connections to the memory cells in the second memory bank.

20. The method of claim 16, further comprising:

establishing the power connections to the MIO controllers based on a trigger signal that is generated at an instant immediately after finishing the power connections to the memory cells in the second memory bank.

* * * * *